United States Patent
Hagino et al.

(10) Patent No.: US 11,962,122 B2
(45) Date of Patent: Apr. 16, 2024

(54) SEMICONDUCTOR LIGHT EMITTING DEVICE AND EXTERNAL RESONANCE TYPE LASER DEVICE

(71) Applicant: PANASONIC CORPORATION, Osaka (JP)

(72) Inventors: Hiroyuki Hagino, Osaka (JP); Shinichiro Nozaki, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 660 days.

(21) Appl. No.: 17/260,890

(22) PCT Filed: Jul. 10, 2019

(86) PCT No.: PCT/JP2019/027263
§ 371 (c)(1),
(2) Date: Jan. 15, 2021

(87) PCT Pub. No.: WO2020/026730
PCT Pub. Date: Feb. 6, 2020

(65) Prior Publication Data
US 2021/0296851 A1      Sep. 23, 2021

(30) Foreign Application Priority Data

Jul. 30, 2018   (JP) .................................. 2018-142782

(51) Int. Cl.
*H01S 5/024*     (2006.01)
*H01S 5/02*      (2006.01)
(Continued)

(52) U.S. Cl.
CPC ........ *H01S 5/02469* (2013.01); *H01S 5/0207* (2013.01); *H01S 5/0237* (2021.01);
(Continued)

(58) Field of Classification Search
CPC ....... H01S 5/02469–02492; H01S 5/40; H01S 5/4031; H01S 5/4062;
(Continued)

(56) References Cited

U.S. PATENT DOCUMENTS 4,925,811 A * 5/1990 Menigaux ............. H01S 5/4043
                                                            438/33
6,084,895 A * 7/2000 Kouchi ................. H01S 5/0235
                                                            372/50.1
(Continued)

FOREIGN PATENT DOCUMENTS

CN   102171899 A  *  8/2011   ............. B82Y 20/00
CN   109417268 A  *  3/2019   ............. H01S 5/022
(Continued)

OTHER PUBLICATIONS

International Search Report and Written Opinion issued in International Patent Application No. PCT/JP2019/027263, dated Oct. 1, 2019; with partial English translation.

(Continued)

*Primary Examiner* — Joshua King
(74) *Attorney, Agent, or Firm* — Rimon P.C.

(57) ABSTRACT

A semiconductor light emitting device includes: a semiconductor light emitting element including a substrate and a plurality of light emitters arranged along an upper surface of the substrate; a first base disposed below a lower surface of the substrate; and a first bonding layer which bonds the semiconductor light emitting element to the first base. In the semiconductor light emitting device, a thermal conductivity of the substrate is higher than a thermal conductivity of the first bonding layer, and a thickness of the first bonding layer is less on one end side than on an other end side in an arrangement direction in which the plurality of light emitters are arranged.

6 Claims, 15 Drawing Sheets

(51) Int. Cl.
  *H01S 5/0237* (2021.01)
  *H01S 5/0239* (2021.01)
  *H01S 5/14* (2006.01)
  *H01S 5/40* (2006.01)

(52) U.S. Cl.
  CPC ........ *H01S 5/0239* (2021.01); *H01S 5/02461* (2013.01); *H01S 5/141* (2013.01); *H01S 5/4087* (2013.01); *H01S 5/40* (2013.01); *H01S 5/4062* (2013.01)

(58) Field of Classification Search
  CPC ........ H01S 5/4087–4093; H01S 5/024–02492; H01S 5/023–02326; H01S 5/0237; H01S 5/0207
  See application file for complete search history.

(56) References Cited

U.S. PATENT DOCUMENTS

| | | | | |
|---|---|---|---|---|
| 6,424,667 | B1* | 7/2002 | Endriz | H01S 5/02476 372/36 |
| 11,398,715 | B2* | 7/2022 | Nozaki | H01S 5/0234 |
| 2003/0006225 | A1* | 1/2003 | Choa | H01S 5/06256 219/494 |
| 2004/0028097 | A1* | 2/2004 | Miyabe | H01S 5/02325 372/44.01 |
| 2005/0141577 | A1* | 6/2005 | Ueta | H01S 5/34333 372/43.01 |
| 2006/0062267 | A1* | 3/2006 | Tanaka | H01S 5/4043 |
| 2007/0177648 | A1* | 8/2007 | Tanaka | H01S 5/4043 |
| 2008/0192206 | A1* | 8/2008 | Takagi | G09G 3/02 372/36 |
| 2008/0291958 | A1* | 11/2008 | Kameyama | H01S 5/10 372/43.01 |
| 2008/0317080 | A1* | 12/2008 | Kameyama | H01S 5/0207 372/44.01 |
| 2009/0104727 | A1* | 4/2009 | Krejci | H01S 5/02492 438/46 |
| 2009/0161354 | A1* | 6/2009 | Hsu | F21V 29/75 362/227 |
| 2012/0051381 | A1* | 3/2012 | Shimizu | H01S 5/4087 372/50.1 |
| 2013/0243019 | A1* | 9/2013 | Wakabayashi | H01S 5/024 372/36 |
| 2015/0303656 | A1* | 10/2015 | Morita | G02B 27/0922 372/44.01 |
| 2016/0099543 | A1* | 4/2016 | Kuramoto | H01S 5/0234 372/36 |
| 2016/0240999 | A1* | 8/2016 | Barbarossa | H01S 5/02326 |
| 2016/0254639 | A1* | 9/2016 | Watanabe | H01S 5/4025 372/36 |
| 2017/0033533 | A1* | 2/2017 | Hamaguchi | H01S 5/18361 |
| 2017/0207605 | A1* | 7/2017 | Morita | H01S 5/4087 |
| 2018/0138664 | A1* | 5/2018 | Huelsewede | H01S 5/02355 |
| 2018/0205199 | A1* | 7/2018 | Kwon | H01S 5/02461 |
| 2018/0278019 | A1* | 9/2018 | Yamauchi | H01S 5/0233 |
| 2019/0097387 | A1* | 3/2019 | Tsai | H01S 5/4025 |
| 2019/0386455 | A1* | 12/2019 | Nagahara | H01S 5/023 |
| 2020/0185877 | A1* | 6/2020 | Kawaguchi | H01S 5/02326 |

FOREIGN PATENT DOCUMENTS

| | | | | |
|---|---|---|---|---|
| DE | 102017122330 A1 | * | 3/2019 | ......... H01S 5/0234 |
| DE | 112018007163 T5 | * | 11/2020 | ......... B65H 29/006 |
| JP | 01-164084 A | | 6/1989 | |
| JP | 04-192483 A | | 7/1992 | |
| JP | 2008-198759 A | | 8/2008 | |
| JP | 2009-111230 A | | 5/2009 | |
| JP | 2011165786 A | * | 8/2011 | |
| JP | 5892918 B | | 3/2016 | |
| JP | 2018-507552 A | | 3/2018 | |
| WO | WO-2006021755 A1 | * | 3/2006 | ......... H01S 5/02252 |
| WO | WO-2017127455 A1 | * | 7/2017 | |
| WO | WO-2018150957 A1 | * | 8/2018 | ............ B60K 35/00 |
| WO | WO-2019021802 A1 | * | 1/2019 | ............ H01S 5/024 |
| WO | WO-2019163276 A1 | * | 8/2019 | |

OTHER PUBLICATIONS

Japanese Office Action dated Nov. 22, 2022 issued in the corresponding Japanese Patent Application No. 2020-534143.

* cited by examiner

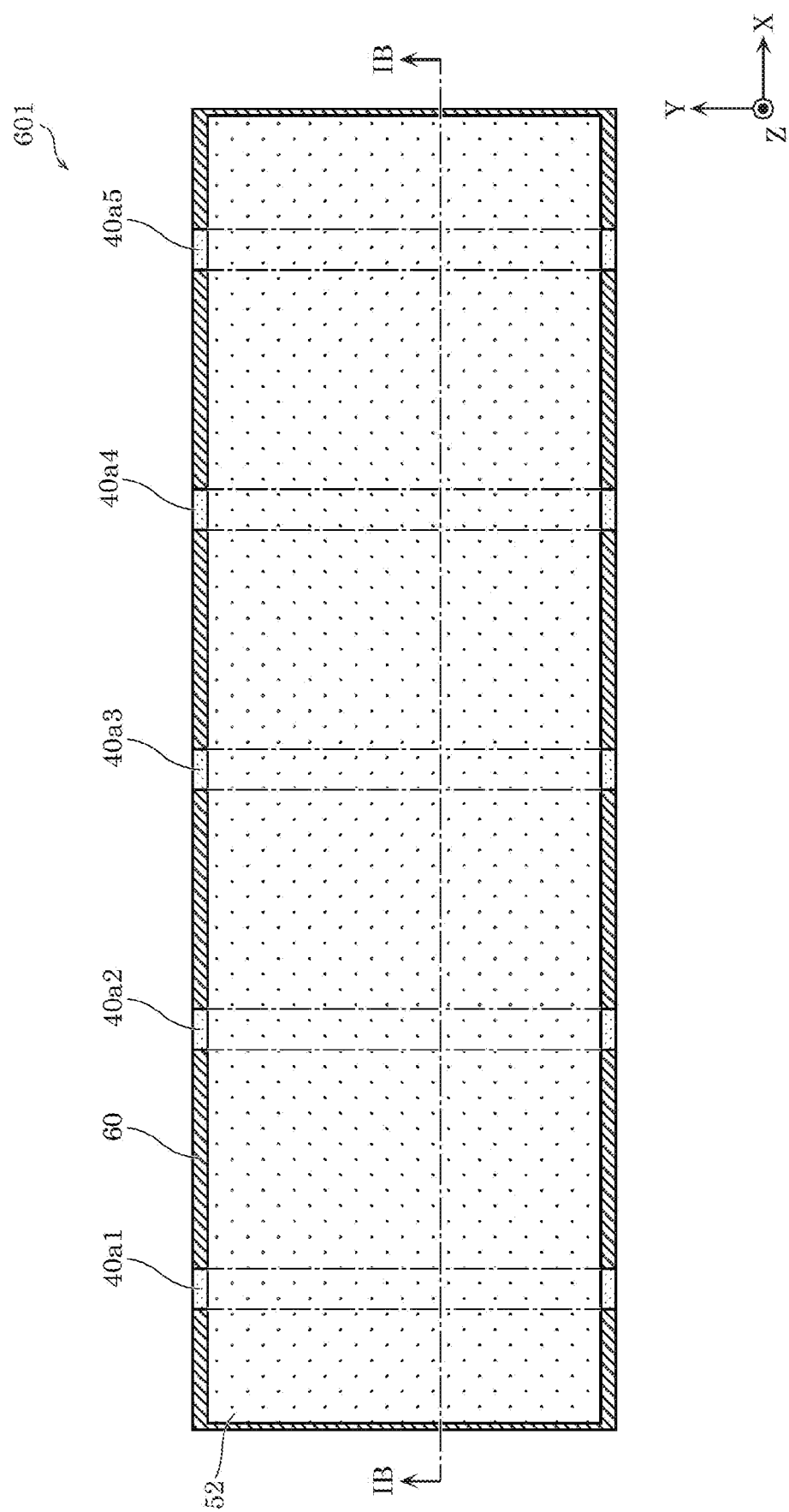

SEMICONDUCTOR LIGHT EMITTING DEVICE AND EXTERNAL RESONANCE TYPE LASER DEVICE

CROSS-REFERENCE OF RELATED APPLICATIONS

This application is the U.S. National Phase under 35 U.S.C. § 371 of International Patent Application No. PCT/JP2019/027263, filed on Jul. 10, 2019, which in turn claims the benefit of Japanese Application No. 2018-142782, filed on Jul. 30, 2018, the entire disclosures of which Applications are incorporated by reference herein.

TECHNICAL FIELD

The present disclosure relates to a semiconductor light emitting device including an arrayed semiconductor light emitting element, and to an external resonance type laser device.

This application is a patent application subject to Article 17 of Industrial Technology Enhancement Act, for a contract research "Development of high-brightness and high-efficiency next-generation laser technologies/Development of new light source and element technologies for future generation processing/Development of GaN-based high-power and high-beam quality semiconductor lasers for high-efficiency processing", National Research and Development Agency, New Energy and Industrial Technology Development Organization, fiscal 2016.

BACKGROUND ART

In recent years, semiconductor light emitting elements such as semiconductor laser elements have gained attention as light sources for various applications such as a light source for an image display device (e.g., a display and a projector), a light source for a vehicular headlamp, a light source for industrial lighting or household lighting, and a light source for industrial equipment (e.g., laser welding equipment, a thin-film annealer, and laser processing equipment). There is a demand that the semiconductor laser elements used as the light sources for the above-described applications have high beam quality and high light output much higher than 1 watt.

A technique widely used for increasing the output of semiconductor laser elements is to arrange wide waveguides in parallel, thereby forming an array. Since high-output semiconductor laser elements generate a great amount of heat during high-output operation, efficient dissipation of heat generated by the waveguides is crucial to achieve high output. In general, a material having a high thermal conductivity is connected in the vicinity of the waveguides to diffuse heat and dissipate heat to the outside via a metal package, for example.

Patent Literature (PTL) 1 discloses a conventional arrayed semiconductor laser element. FIG. 9 is a schematic front view illustrating a configuration of conventional arrayed semiconductor laser element 1010 disclosed in PTL 1.

As illustrated in FIG. 9, conventional arrayed semiconductor laser element 1010 includes a plurality of stripes 1011 to 1014 arranged in a line at predetermined spacings. Each of the plurality of stripes 1011 to 1014 is a light emitter serving as a waveguide of a laser beam. Arrayed semiconductor laser element 1010 includes a plurality of laser electrodes 1008 that are separately provided in one-to-one correspondence with the stripes. The plurality of laser electrodes 1008 of arrayed semiconductor laser element 1010 are disposed in positions opposite a plurality of metal lines 1007 provided on support body 1003. The plurality of laser electrodes 1008 are thermocompression-bonded with the plurality of metal lines 1007 via electrically-conductive adhesives 1006 such as solder. With this, the plurality of laser electrodes 1008 and the plurality of metal lines 1007 are electrically conducted, and arrayed semiconductor laser element 1010 is physically fixed to support body 1003. Further, a gap between arrayed semiconductor laser element 1010 and support body 1003 is filled with high thermal conductive resin 1009.

As a technique to realize a high quality beam, a wavelength beam combining method is used in which a plurality of laser beams having different oscillation wavelengths are focused using an optical system. Since this wavelength beam combining method can focus light on one point, a high quality beam can be realized. A distributed feedback (DFB) laser, a distributed bragg reflector (DBR) laser, or an external resonator which includes an optical element is used as a structure capable of precisely controlling the oscillation wavelength of each laser.

PTL 2 discloses an example of an optical system which employs the wavelength beam combining method. FIG. 10 illustrates an example of an optical system which employs the wavelength beam combining method.

As illustrated in FIG. 10, light emitted from laser array 1100 is focused on second diffraction grating 1104 via optical lens 1102 and first diffraction grating 1103. Each of first diffraction grating 1103 and second diffraction grating 1104 is a wavelength dispersion element whose relationship between the incident angle and the reflection (diffraction) angle of light has wavelength dependence. Through adjustment of the angles of first diffraction grating 1103 and second diffraction grating 1104 relative to incident light, first diffraction grating 1103 and second diffraction grating 1104 are capable of combining light beams of different wavelengths into one light beam. The combined light beam is extracted to the outside via output coupler 1105 which includes a partial reflector. Some light is reflected by output coupler 1105 and fed back to the laser array again. This is how laser array 1100 and output coupler 1105 form an external resonator structure. For each diffraction grating, the optical path depends on the wavelength, and thus, laser beams emitted from a plurality of waveguides (that is, light emitters) of the laser array have different oscillation wavelengths.

CITATION LIST

Patent Literature

PTL 1: Japanese Unexamined Patent Application Publication No. H01-164084

PTL 2: Japanese Patent No. 5892918

SUMMARY OF THE INVENTION

Technical Problem

However, in the case of using such an optical system combining an external resonator and diffraction gratings, since the oscillation wavelengths in the waveguides of the laser array are determined by the incident angle with respect to the diffraction gratings, the oscillation wavelengths in the waveguides of the laser array change unidirectionally according to the positions of the waveguides. For example, the oscillation wavelengths of the laser array gradually become longer or shorter, from a waveguide located at one end toward a waveguide located at the other end. In the meantime, as for the laser array, since the temperature is generally highest at the central waveguide, the gain spectrum necessary for oscillation has long wavelengths in the central waveguide and short wavelengths in the waveguides located at both ends. In such a state, there may occur, in one or more of the waveguides, disagreement between the gain spectrum determined by temperature distribution and the oscillation wavelength determined by the optical system. This causes a problem that the laser emission efficiency significantly declines.

The present disclosure has an object to provide a semiconductor light emitting device and so on that inhibit a decline in efficiency.

Solutions to Problem

To achieve the above object, a semiconductor light emitting device according to an aspect of the present disclosure includes: a semiconductor light emitting element including a substrate and a plurality of light emitters arranged along an upper surface of the substrate; a first base disposed below a lower surface of the substrate; and a first bonding layer which bonds the semiconductor light emitting element to the first base. In the semiconductor light emitting device, a thermal conductivity of the substrate is higher than a thermal conductivity of the first bonding layer, and a thickness of the first bonding layer is less on one end side than on an other end side in an arrangement direction in which the plurality of light emitters are arranged.

With this, as compared to the temperatures of waveguide portions on the one end side, the temperatures of waveguide portions on the other end side can be made high. Thus, the gain spectra of the waveguide portions on the other end side can be shifted to the long wavelength side. With such a semiconductor light emitting device, the oscillation wavelengths in the waveguide portions can gradually become longer, from the waveguide portions on the one end side toward the waveguide portions on the other end side. With this, for example, when an external resonance type laser device is assembled from such a semiconductor light emitting device and a wavelength dispersion element, it is possible to bring into agreement the oscillation wavelengths in the waveguide portions determined by the external resonator and the gain spectra of the waveguide portions of the semiconductor light emitting device. Accordingly, it is possible to inhibit a decline in the light emission efficiency of each waveguide portion of the semiconductor light emitting device.

In the semiconductor light emitting device according to an aspect of the present disclosure, a thickness of the substrate may be greater on the one end side than on the other end side in the arrangement direction.

In the semiconductor light emitting device according to an aspect of the present disclosure, the lower surface of the substrate may be tilted relative to the upper surface of the substrate in the arrangement direction.

In the semiconductor light emitting device according to an aspect of the present disclosure, the upper surface of the substrate may be parallel to a bonding surface of the first base bonded with the first bonding layer in the arrangement direction.

This allows the propagation direction of light emitted from the semiconductor light emitting element and the upper surface of the first base to be substantially parallel, and thus, the upper surface of the first base can be used as the reference for optical axis alignment. Accordingly, it is possible to realize a semiconductor light emitting device which allows easy optical axis adjustment.

The semiconductor light emitting device according to an aspect of the present disclosure may further include: a second base disposed on an opposite side of the semiconductor light emitting element from the first base; and a second bonding layer which bonds the semiconductor light emitting element to the second base.

As described above, with the semiconductor light emitting device according to the present disclosure, the semiconductor light emitting element is interposed between bases that are disposed on both sides of the semiconductor light emitting element. Therefore, by forming each base with a high thermal conductive material, it is possible to further enhance the heat dissipation of the semiconductor light emitting element.

In the semiconductor light emitting device according to an aspect of the present disclosure, a thermal conductivity of the first base may be higher than the thermal conductivity of the first bonding layer.

To achieve the above object, a semiconductor light emitting device according to an aspect of the present disclosure includes: a semiconductor light emitting element including a substrate and a plurality of light emitters arranged along an upper surface of the substrate; a first base disposed below a lower surface of the substrate; and a first bonding layer which bonds the semiconductor light emitting element to the first base. In the semiconductor light emitting device, a thermal conductivity of the first base is higher than a thermal conductivity of the first bonding layer, and a thickness of the first bonding layer is less on one end side than on an other end side in an arrangement direction in which the plurality of light emitters are arranged.

With this, as compared to the temperatures of waveguide portions on the one end side, the temperatures of waveguide portions on the other end side can be made high. Thus, the gain spectra of the waveguide portions on the other end side can be shifted to the long wavelength side. With such a semiconductor light emitting device, the oscillation wavelengths in the waveguide portions can gradually become longer, from the waveguide portions on the one end side toward the waveguide portions on the other end side. With this, for example, when an external resonance type laser device is assembled from such a semiconductor light emitting device and a wavelength dispersion element, it is possible to bring into agreement the oscillation wavelengths in the waveguide portions determined by the external resonator and the gain spectra of the waveguide portions of the semiconductor light emitting device. Accordingly, it is possible to inhibit a decline in the light emission efficiency of each waveguide portion of the semiconductor light emitting device.

In the semiconductor light emitting device according to an aspect of the present disclosure, a thickness of the first base may be greater on the one end side than on the other end side.

To achieve the above object, an external resonance type laser device according to an aspect of the present disclosure includes the above semiconductor light emitting device and a wavelength dispersion element.

With this, as compared to the temperatures of waveguide portions on the one end side, the temperatures of waveguide portions on the other end side can be made high. Thus, the gain spectra of the waveguide portions on the other end side can be shifted to the long wavelength side. With such a semiconductor light emitting device, the oscillation wavelengths in the waveguide portions can gradually become longer, from the waveguide portions on the one end side toward the waveguide portions on the other end side. With this, for example, it is possible to bring into agreement the oscillation wavelengths in the waveguide portions determined by the external resonator and the gain spectra of the waveguide portions of the semiconductor light emitting device. Accordingly, it is possible to inhibit a decline in the light emission efficiency of each waveguide portion of the semiconductor light emitting device.

Advantageous Effect of Invention

According to the present disclosure, it is possible to provide a semiconductor light emitting device and so on that inhibit a decline in efficiency.

BRIEF DESCRIPTION OF DRAWINGS

FIG. 1A is a schematic top view illustrating a configuration of a semiconductor light emitting element according to an embodiment.

DESCRIPTION OF EXEMPLARY EMBODIMENT

Figure 1B:
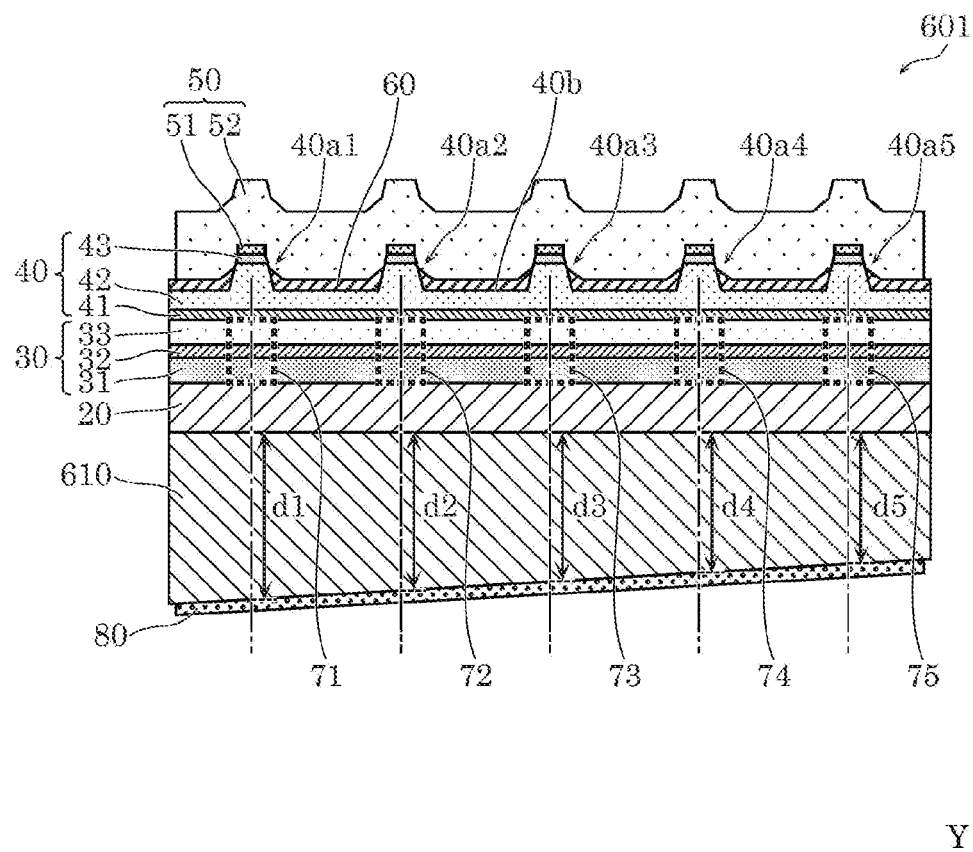
FIG. 1B is a schematic cross-sectional view illustrating a configuration of the semiconductor light emitting element according to the embodiment.

Hereinafter, an embodiment of the present disclosure will be described with reference to the accompanying drawings. Note that the embodiment described below illustrates a specific example. Therefore, the numerical values, shapes, materials, constituent elements, the arrangement and connection of the constituent elements, steps (processes), the processing order of the steps, etc. illustrated in the embodiment below are mere examples, and do not intend to limit the present disclosure. As such, among the constituent elements in the embodiment described below, constituent elements not recited in any of the independent claims defining the most generic concepts of the present disclosure will be described as optional constituent elements.

The drawings are represented schematically and are not necessarily precise illustrations. Thus, the scales of the drawings, for example, are not necessarily precise. In the drawings, essentially the same constituent elements are given the same reference signs in the figures, and overlapping descriptions thereof are omitted or simplified.

In the present description and drawings, the X axis, the Y axis, and the Z axis represent the three axes of the three-dimensional orthogonal coordinate system. The X axis and the Y axis are orthogonal to each other, and both are also orthogonal to the Z axis.

Furthermore, the terms "above" and "below" are used in the present description as terms which do not refer to the upward direction (vertically upward) and the downward direction (vertically downward) in the absolute space recognition, but are defined by the relative positional relationship based on the stacking order of a multilayer configuration. In addition, the terms "above" and "below" are applied not only when two constituent elements are disposed apart from each other and there is another constituent element between the two constituent elements, but also when two constituent elements are disposed in contact with each other.

EMBODIMENT

The following describes a semiconductor light emitting device according to an embodiment.

[Configuration of Semiconductor Light Emitting Element]

First, a configuration of a semiconductor light emitting element included in the semiconductor light emitting device according to the embodiment will be described with reference to FIG. 1A and FIG. 1B. FIG. 1A and FIG. 1B are a schematic top view and a schematic cross-sectional view, respectively, each illustrating a configuration of semiconductor light emitting element 601 according to the present embodiment. FIG. 1B is a cross-sectional view of semiconductor light emitting element 601 taken at line IB-IB in FIG. 1A.

As illustrated in FIG. 1B, semiconductor light emitting element 601 according to the present embodiment is an element that includes substrate 610 and a plurality of light emitters arranged along the upper surface of substrate 610. As illustrated in FIG. 1B, in the present embodiment, semiconductor light emitting element 601 includes five light emitters 71 to 75 arranged in the X axis direction in FIG. 1B along the principal surface of substrate 610. The direction in which five light emitters 71 to 75 are arranged coincides with the X axis direction illustrated in the drawings. Hereinafter, the direction in which five light emitters 71 to 75 are arranged is also simply referred to as the "arrangement direction". In the present embodiment, semiconductor light emitting element 601 is a semiconductor laser element including a nitride semiconductor material, and includes substrate 610, first semiconductor layer 20, light emitting layer 30, second semiconductor layer 40, electrode component 50, dielectric layers 60, and n-side electrode 80.

As illustrated in FIG. 1B, second semiconductor layer 40 includes: waveguide portions 40a1 to 40a5 having protrusions that form stripes extending in the laser resonator length direction (the Y axis direction in FIG. 1B); and flat portions 40b extending from the basal portions of the waveguide portions in the lateral direction (in other words, the X axis direction in FIG. 1B).

The positions of waveguide portions 40a1 to 40a5 correspond to the positions of light emitters 71 to 75, respectively.

It is sufficient so long as the total number of waveguide portions provided in semiconductor light emitting element 601 is two or more, and it may be five or more in the case of causing semiconductor light emitting element 601 to operate with high light output (for example, in the watt class). In the present embodiment, semiconductor light emitting element 601 includes five waveguide portions 40a1 to 40a5. Waveguide portions 40a1 to 40a5 are disposed in parallel to one another. With this, the light emitters corresponding to the waveguide portions emit light in the same direction.

The width and spacing (the center-to-center distance) of each waveguide portion are not particularly limited. For example, the width of each waveguide portion in the X axis direction is at least 1 μm and at most 100 μm, and the spacing between adjacent waveguide portions is at least 50 μm and at most 1000 μm. In the case of causing semiconductor light emitting element 601 to operate with high light output (for example, in the watt class), the width of each waveguide portion may be at least 10 μm and at most 50 μm, and the spacing between adjacent waveguide portions may be at least 300 μm and at most 500 μm. In the present embodiment, the width of each waveguide portion is 30 μm, and the spacing is 400 μm. The waveguide portions need not be equally spaced in semiconductor light emitting element 601. In consideration of influence of the temperature distribution, stress, etc., in semiconductor light emitting element 601, the waveguide portions may be unequally spaced.

The height of each waveguide portion, which is not particularly limited, is at least 100 nm and at most 1 μm, for example. In the case of causing semiconductor light emitting element 601 to operate with high light output (for example, in the watt class), the height of each waveguide portion may be at least 300 nm and at most 800 nm. In the present embodiment, the height of each waveguide portion is 600 nm.

Substrate 610 is a GaN substrate, for example. In the present embodiment, an n-type hexagonal GaN substrate whose principal surface is the (0001) plane is used as substrate 610.

First semiconductor layer 20 is disposed above substrate 610. First semiconductor layer 20 is, for example, an n-side cladding layer including n-type AlGaN.

Light emitting layer 30 is disposed above first semiconductor layer 20. Light emitting layer 30 includes a nitride semiconductor. For example, as illustrated in FIG. 1B, light emitting layer 30 has a multilayer structure in which n-side light guide layer 31 including n-GaN, active layer 32 including an InGaN quantum well layer, and p-side light guide layer 33 including p-GaN are stacked in sequence from the first semiconductor layer 20 side. Light emitting layer 30 includes light emitters 71 to 75. Light emitters 71 to 75 are portions of light emitting layer 30 that are disposed in positions corresponding to waveguide portions 40a1 to 40a5, and are portions where a large proportion of light emitted from semiconductor light emitting element 601 is generated and propagated. In the present embodiment, each light emitter is disposed below the corresponding waveguide portion (that is, on the lower side in FIG. 1B). The width of each light emitter (that is, the width in the X axis direction in FIG. 1B) is about the same as the width of each waveguide portion (that is, the width in the X axis direction in FIG. 1B). Note that light may be generated or propagated also in portions other than light emitters 71 to 75.

Second semiconductor layer 40 is disposed above light emitting layer 30. For example, as illustrated in FIG. 1B, second semiconductor layer 40 has a multilayer structure in which electron barrier layer 41 including AlGaN, p-side cladding layer 42 including a p-type AlGaN layer, and p-side contact layers 43 including p-type GaN are stacked in sequence from the light emitting layer 30 side. P-side contact layers 43 are formed as the top layers of waveguide portions 40a1 to 40a5.

These layers can be formed in almost uniform thickness through adjustment of the growth conditions.

As illustrated in FIG. 1B, p-side cladding layer 42 has protrusions. The protrusions of p-side cladding layer 42 and p-side contact layers 43 form waveguide portions 40a1 to 40a5 in stripes. P-side cladding layer 42 also has planar portions as flat portions 40b on both lateral sides of each waveguide portion. That is to say, the top surfaces of flat portions 40b form the upper surface of p-side cladding layer 42, and p-side contact layers 43 are not formed on the top surfaces of flat portions 40b.

Electrode component 50 is disposed above second semiconductor layer 40. Electrode component 50 is wider than each of the waveguide portions. In other words, the width (width in the X-axis direction) of electrode component 50 is greater than the width (width in the X-axis direction) of each waveguide portion. Electrode component 50 is in contact with dielectric layers 60 and the upper surface of each waveguide portion.

In the present embodiment, electrode component 50 includes p-side electrodes 51 used for supplying current to each light emitter, and pad electrode 52 disposed above p-side electrodes 51.

Each p-side electrode 51 is in contact with the upper surface of a waveguide portion. Each p-side electrode 51 is an ohmic electrode having an ohmic contact with p-side contact layer 43 above a waveguide portion, and is in contact with the upper surface of p-side contact layer 43, which is the upper surface of the waveguide portion. Each p-side electrode 51 is formed using, for example, a metal material such as Pd, Pt. and Ni. In the present embodiment, each p-side electrode 51 has a two-layer structure of Pd/Pt.

Pad electrode 52 is wider than each of the waveguide portions, and is in contact with dielectric layers 60. In other words, pad electrode 52 is formed to cover each waveguide portion and each dielectric layer 60. Pad electrode 52 is formed using, for example, a metal material such as Ti, Ni, Pt, and Au. In the present embodiment, pad electrode 52 has a three-layer structure of Ti/Pt/Au.

Note that, as illustrated in FIG. 1A, in a top view of semiconductor light emitting element 601, pad electrode 52 is formed inside dielectric layers 60 (that is, inside second semiconductor layer 40) in order to achieve yield enhancement in singulation of semiconductor light emitting element 601. In other words, in a top view of semiconductor light emitting element 601, pad electrode 52 is not formed at the peripheral edge of semiconductor light emitting element 601. With this, semiconductor light emitting element 601 has a non-current-injection region, that is, current is not supplied to the peripheral edge of semiconductor light emitting element 601. In any part of the region where pad electrode 52 is formed, the shape in a cross section perpendicular to the longitudinal direction of the waveguide portions (that is, the Y axis direction) is the shape illustrated in FIG. 1B.

Dielectric layers 60 are insulating films disposed on the side surfaces of the waveguide portions to confine light. Specifically, each dielectric layer 60 is continuously formed from the side surfaces of waveguide portions (that is, the surfaces intersecting the X axis direction in FIG. 1B) to flat portion 40b. In the present embodiment, each dielectric layer 60 is continuously formed over the side surfaces of p-side contact layers 43, the side surfaces of the protrusions of p-side cladding layer 42, and the upper surface of p-side cladding layer 42. In the present embodiment, dielectric layers 60 are formed with $SiO_2$.

Although the shape of each dielectric layer 60 is not particularly limited, each dielectric layer 60 may be in contact with the side surfaces of waveguide portions and flat portion 40b. With this, light emitted directly below the waveguide portions can be stably confined.

As for semiconductor light emitting elements which are intended to operate with high light output (that is, intended for high-output operation), an end-surface coating film such as a dielectric multilayer film is formed on the light emission end surface. The end-surface coating film is difficult to be formed only on the end surface, and gets onto the upper surface of semiconductor light emitting element 601 as well. When the end-surface coating film gets onto the upper surface, dielectric layers 60 and the end-surface coating film may come into contact with each other at the edge portions of semiconductor light emitting element 601 in the longitudinal direction, because pad electrode 52 is not formed at the edge portions of semiconductor light emitting element 601 in the laser resonator length direction (that is, the Y axis direction in FIG. 1A and FIG. 1B) If dielectric layers 60 are not formed or dielectric layers 60 are thin with respect to the light confinement, light is affected by the end-surface coating film, thus causing light loss. In view of this, the thickness of each dielectric layer 60 may be at least 100 nm in order to sufficiently confine light generated by light emitting layer 30. On the other hand, if dielectric layers 60 are too thick, it becomes difficult to form pad electrode 52, and thus, the thickness of each dielectric layer 60 may be less than or equal to the height of each waveguide portion.

Also, etching damage from an etching process performed for forming the waveguide portions may remain in the side surfaces of the waveguide portions and flat portions 40b, and could cause current leakage. In the present embodiment, however, it is possible to reduce occurrence of undesired current leakage by covering the waveguide portions and flat portions 40b with dielectric layers 60.

N-side electrode 80 is an electrode disposed below substrate 610, and is an ohmic electrode having an ohmic contact with substrate 610. N-side electrode 80 is a multilayer film including Ti/Pt/Au, for example. The configuration of n-side electrode 80 is not limited to this example. N-side electrode 80 may be a multilayer film in which Ti and Au are stacked.

As illustrated in FIG. 1B, substrate 610 has varying thicknesses according to the positions of waveguide portions 40a1 to 40a5 in the arrangement direction (the X axis direction). In the present embodiment, the thicknesses of substrate 610 immediately below the waveguide portions are defined as d1, d2, d3, d4, and d5, starting from the thickness immediately below the leftmost waveguide portion. Note that the substrate thickness immediately below each waveguide portion is the distance from the boundary between substrate 610 and first semiconductor layer 20 to the boundary between substrate 610 and n-side electrode 80, along a line which passes through the center of the waveguide portion (or the light emitter) in the width direction (the X axis direction) and which is perpendicular to the boundary surface between substrate 610 and first semiconductor layer 20. In the present embodiment, the thicknesses of substrate 610 continuously change from the thickness immediately below leftmost waveguide portion 40a1 to the thickness immediately below rightmost waveguide portion 40a5, and have a relationship of d1>d2>d3>d4>d5. That is to say, the thickness of substrate 610 is greater on one end side than on the other end side in the arrangement direction. In addition, the lower surface of substrate 610 (the surface on the lower side in FIG. 1B) is tilted relative to the upper surface of substrate 610 in the arrangement direction. Functions and advantageous effects of semiconductor light emitting element 601 having such substrate 610 will be described later.

[Manufacturing Method of Semiconductor Light Emitting Element]

Next, a manufacturing method of semiconductor light emitting element 601 according to the present embodiment will be described with reference to FIG. 2A to FIG. 2I. FIG. 2A to FIG. 2I are cross-sectional views illustrating processes included in the manufacturing method of semiconductor light emitting element 601 according to the present embodiment.

Figure 2A:
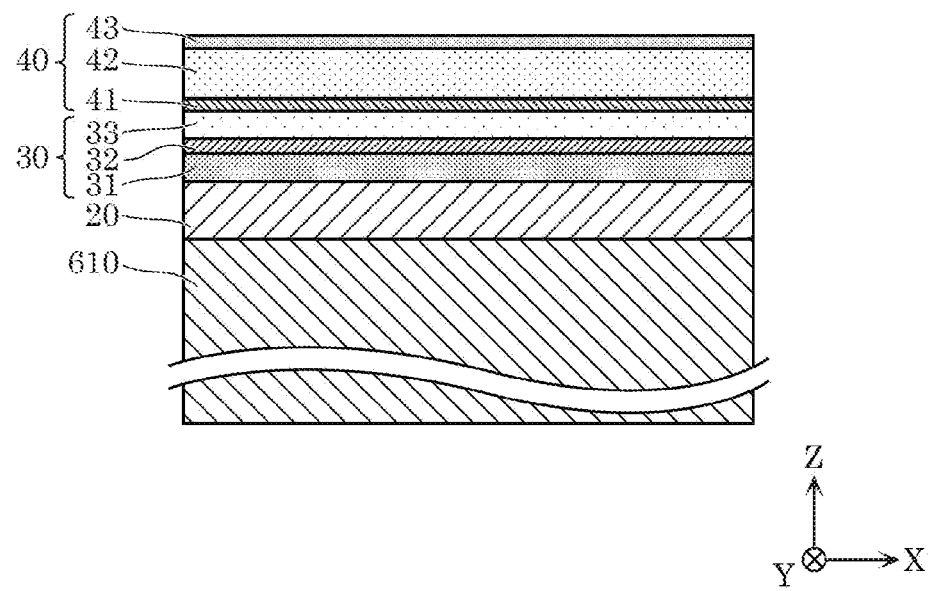
FIG. 2A is a cross-sectional view illustrating processes of forming a first semiconductor layer, a light emitting layer, and a second semiconductor layer in a manufacturing method of the semiconductor light emitting element according to the embodiment.

First, as illustrated in FIG. 2A, first semiconductor layer 20, light emitting layer 30, and second semiconductor layer 40 are sequentially formed on substrate 610 that is an n-type hexagonal GaN substrate whose principal surface is the (0001) plane, by metalorganic chemical vapor deposition (MOCVD).

Specifically, an n-side cladding layer including n-type AlGaN is grown by 3 μm as first semiconductor layer 20 on substrate 610 that has a thickness of 400 μm. Subsequently, n-side light guide layer 31 including n-GaN is grown by 0.1 μm. Subsequently, active layer 32 that includes three sets of a barrier layer including InGaN and an InGaN quantum well layer is grown. Subsequently, p-side light guide layer 33 including p-GaN is grown by 0.1 μm. Subsequently, electron barrier layer 41 including AlGaN is grown by 10 nm. Subsequently grown is p-side cladding layer 42 including a strained superlattice that has a thickness of 0.48 μm and is formed by forming 160 sets of a p-AlGaN layer having a thickness of 1.5 nm and a GaN layer having a thickness of 1.5 nm. Subsequently, p-side contact layer 43 including p-GaN is grown by 0.05 μm. Here, in each layer, trimethylgallium (TMG), trimethylammonium (TMA), and trimethylindium (TMI), for example, are used as an organic metal material including Ga, an organic metal material including Al, and an organic metal material including In, respectively. Ammonia ($NH_3$) is used as a nitrogen material.

Figure 2B:
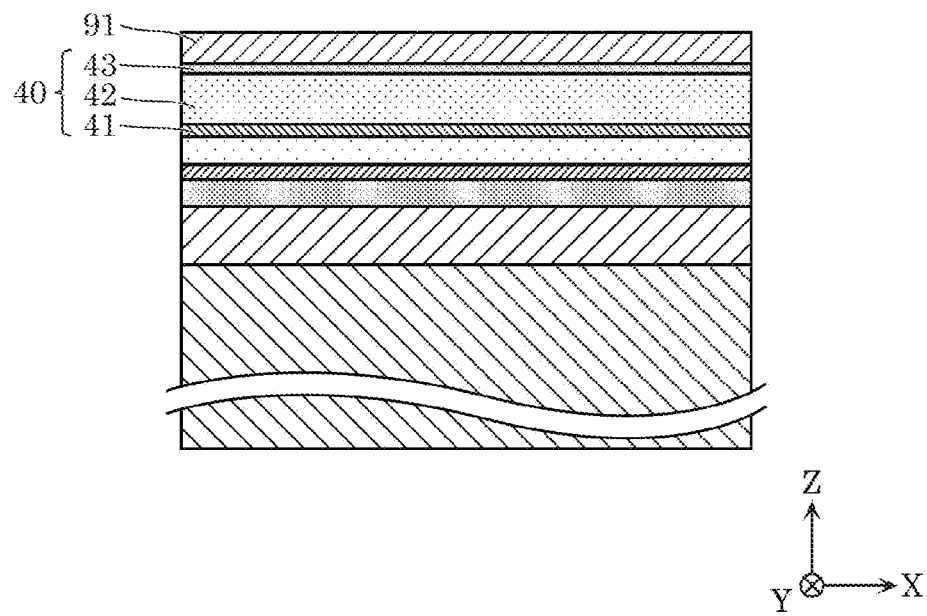
FIG. 2B is a cross-sectional view illustrating a process of forming a first protection film in the manufacturing method of the semiconductor light emitting element according to the embodiment.

Next, as illustrated in FIG. 2B, first protection film 91 is formed on second semiconductor layer 40. Specifically, a silicon oxide film ($SiO_2$) of 300 nm in thickness is formed as first protection film 91 on p-side contact layer 43 by plasma chemical vapor deposition (CVD) using silane ($SiH_4$).

Note that the method of forming first protection film 91 is not limited to the plasma CVD, and publicly-known film-forming methods such as thermal CVD, sputter deposition, vacuum deposition, and pulsed laser deposition may be used. The material for forming first protection film 91 is not limited to the one described above. It is sufficient so long as it is a material, such as a dielectric or metal, having selectivity with respect to etching of second semiconductor layer 40 (p-side cladding layer 42 and p-side contact layer 43) which will be described later.

Figure 2C:
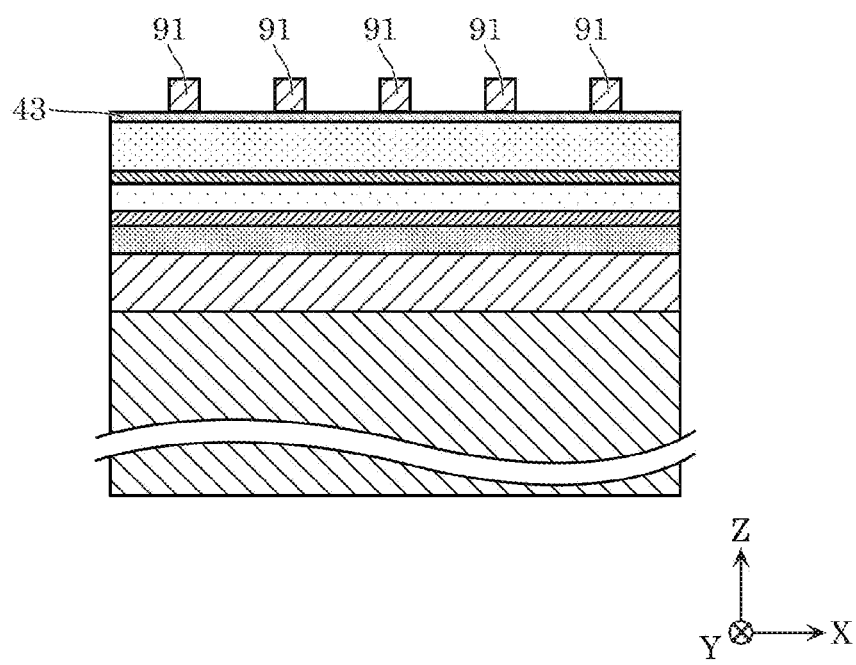
FIG. 2C is a cross-sectional view illustrating a process of patterning the first protection film in the manufacturing method of the semiconductor light emitting element according to the embodiment.

Next, as illustrated in FIG. 2C, first protection film 91 is selectively removed by photolithography and etching, in a manner that first protection film 91 remains in the shape of bands. Examples of etching include dry etching by reactive ion etching (RIE) which uses a fluorine-containing gas such as $CF_4$ and wet etching which uses, for example, hydrofluoric acid (HF) diluted at a ratio of approximately 1:10.

Figure 2D:
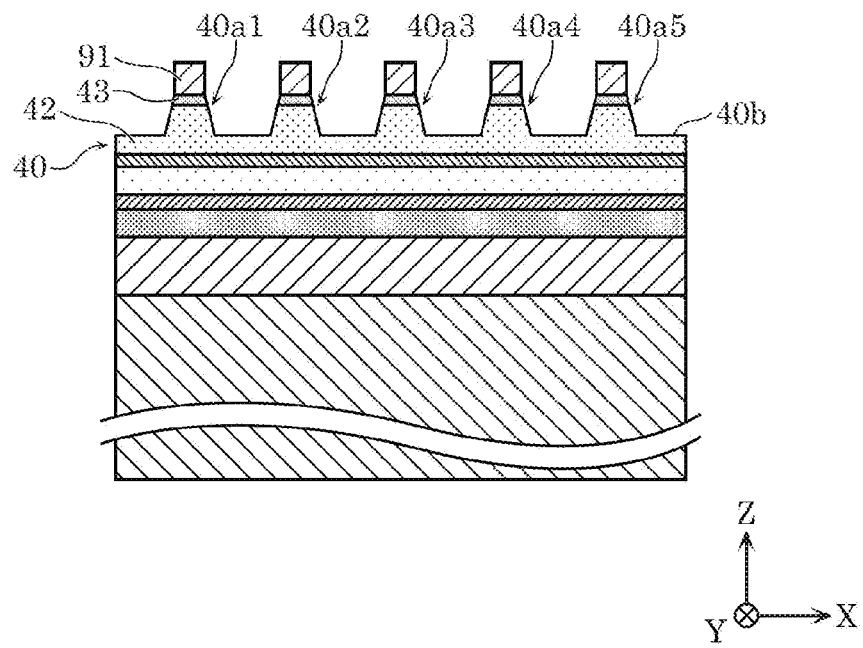
FIG. 2D is a cross-sectional view illustrating a process of forming waveguide portions and flat portions in the manufacturing method of the semiconductor light emitting element according to the embodiment.

Next, as illustrated in FIG. 2D, with band-shaped first protection films 91 serving as masks, p-side contact layer 43 and p-side cladding layer 42 are etched to form waveguide portions 40a1 to 40a5 and flat portions 40b in second semiconductor layer 40. P-side contact layer 43 and p-side cladding layer 42 may be dry-etched by RIE using a chlorine-containing gas such as $Cl_2$.

Figure 2E:
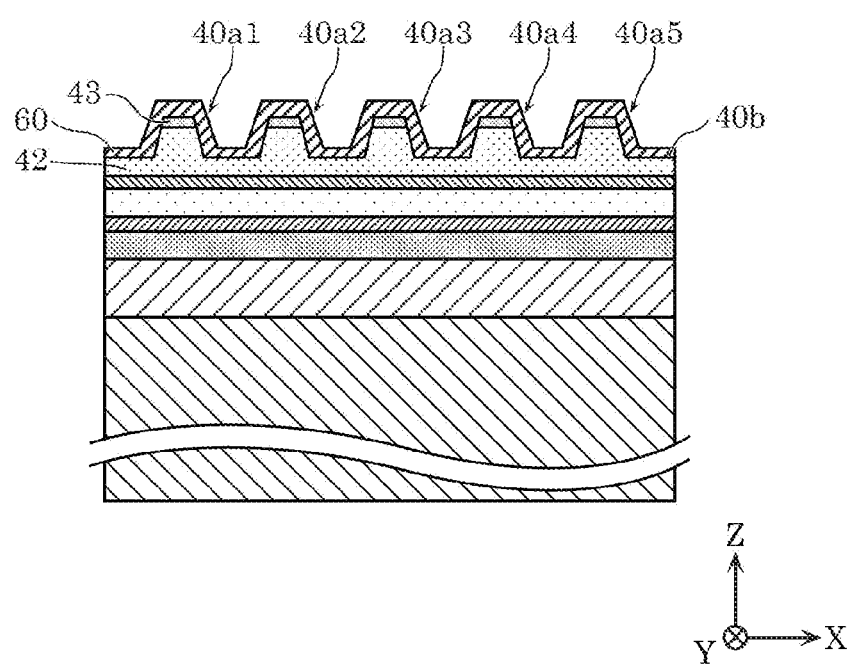
FIG. 2E is a cross-sectional view illustrating a process of forming a dielectric layer in the manufacturing method of the semiconductor light emitting element according to the embodiment.

Next, as illustrated in FIG. 2E, band-shaped first protection films 91 are removed by wet etching using, for example, hydrofluoric acid, and after that, dielectric layer 60 is formed to cover p-side contact layers 43 and p-side cladding layer 42. In other words, dielectric layer 60 is formed on waveguide portions 40a1 to 40a5 and flat portions 40b. A silicon oxide film ($SiO_2$) of 300 nm in thickness is formed as dielectric layer 60 by plasma CVD using silane ($SiH_4$), for example.

Note that the method of forming dielectric layer 60 is not limited to plasma CVD, and other film-forming methods such as thermal CVD, sputter deposition, vacuum deposition, and pulsed laser deposition may be used.

Figure 2F:
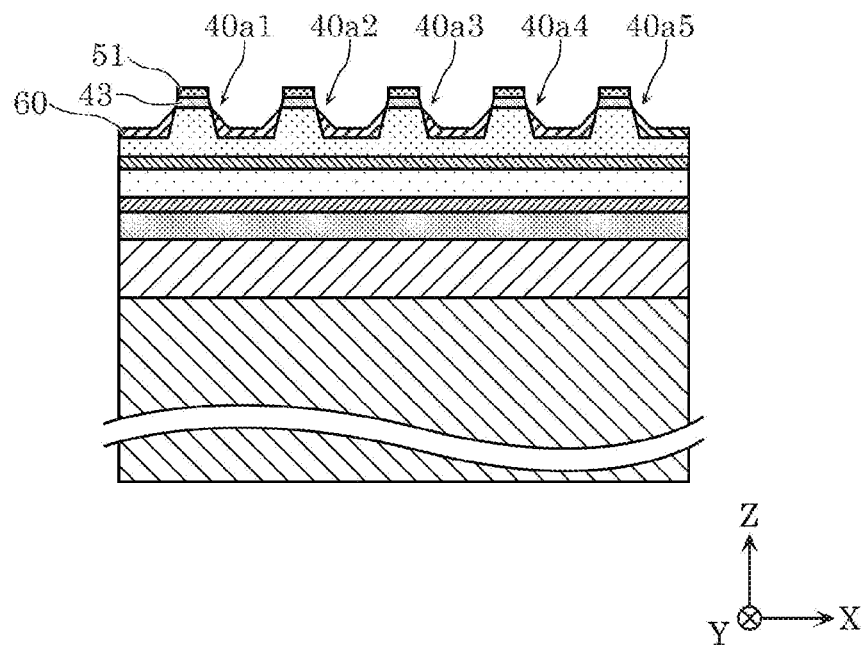
FIG. 2F is a cross-sectional view illustrating a process of forming p-side electrodes in the manufacturing method of the semiconductor light emitting element according to the embodiment.

Next, as illustrated in FIG. 2F, the upper surfaces of p-side contact layers 43 are exposed by removing only the portions of dielectric layer 60 that are on waveguide portions 40a1 to 40a5 by photolithography and wet etching using hydrofluoric acid. Thereafter, p-side electrodes 51 including Pd/Pt are formed only on waveguide portions 40a1 to 40a5 by vacuum deposition and a lift-off technique. Specifically, p-side electrodes 51 are formed on p-side contact layers 43 exposed from dielectric layers 60.

Note that the method of forming p-side electrodes 51 is not limited to vacuum deposition, and may be sputter deposition, pulsed laser deposition, or the like. Any electrode material may be used for p-side electrodes 51, so long as it is a material that has an ohmic contact with second semiconductor layer 40 (p-side contact layers 43), such as a Ni/Au-based material or a Pt-based material.

Figure 2G:
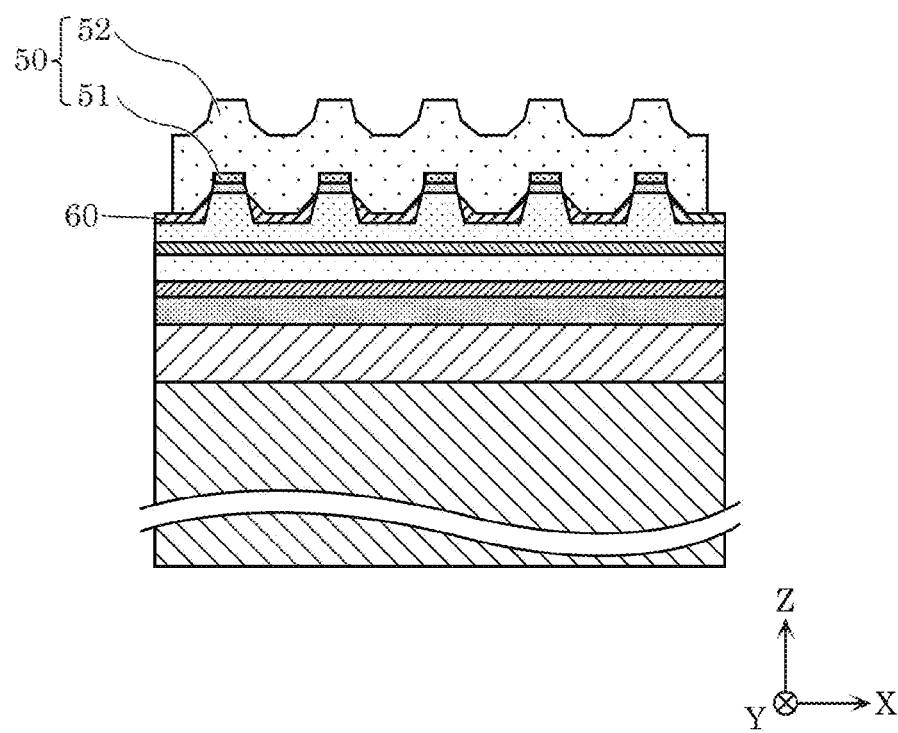
FIG. 2G is a cross-sectional view illustrating a process of forming a pad electrode in the manufacturing method of the semiconductor light emitting element according to the embodiment.

Next, as illustrated in FIG. 2G, pad electrode 52 is formed to cover p-side electrodes 51 and dielectric layers 60. Specifically, a resist is patterned by photolithography etc. on a region other than the region where pad electrode 52 is desired, and pad electrode 52 including Ti/Pt/Au is formed by vacuum deposition etc. on the entire surface above substrate 610, and thereafter, unneeded part of the electrode is removed using a lift-off technique. This makes it possible to form pad electrode 52 in a predetermined shape on p-side electrodes 51 and dielectric layers 60. Electrode component 50 including p-side electrodes 51 and pad electrode 52 is formed in the manner described above.

Figure 2H:
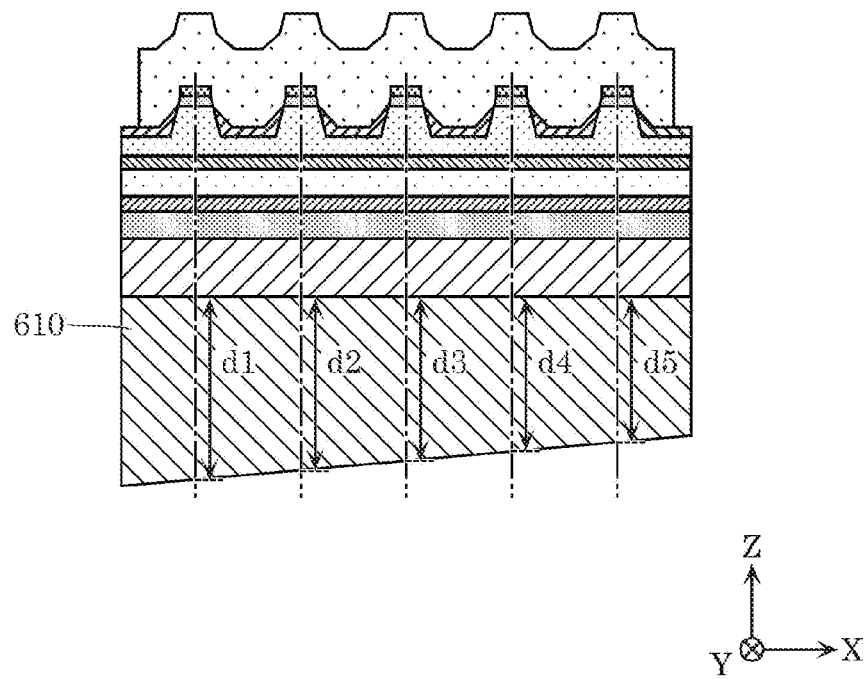
FIG. 2H is a cross-sectional view illustrating a process of tilting a surface of a substrate in the manufacturing method of the semiconductor light emitting element according to the embodiment.

Next, substrate 610 is thinned as illustrated in FIG. 2H. This is to facilitate singulation and to enhance heat dissipation. Substrate 610 can be thinned by physical and chemical polishing using abrasive grains and a chemical solution. In the present embodiment, substrate 610 having a thickness of 400 μm is thinned to a thickness of approximately 85 μm. When doing so, the thickness distribution of substrate 610 can be controlled by tilting substrate 610 relative to the polishing surface. Specifically, substrate 610 is tilted at approximately 0.1 degrees relative to the polishing table and then polished so that one end of substrate 610 becomes thicker than the other end of substrate 610 by approximately 3 μm. In the present embodiment, the substrate thicknesses (d1 to d5) defined in FIG. 1B are: d1=86.1 μm, d2=85.4 μm, d3=84.8 μm, d4=83.9 μm, and d5=83.2 μm. In such a manner, it is possible to continuously change the thicknesses of substrate 610 and tilt the lower surface of substrate 610 relative to the upper surface of substrate 610 in the arrangement direction.

Note that a technique other than polishing, such as dry etching, can also adjust the thickness distribution of the substrate. Plasma is generated by applying a high voltage to a reactive gas, and etching progresses as a result of collision of ion or radical in the plasma with the wafer. At this time, the amount of etching can be adjusted according to the positions on substrate 610 if the density or energy of plasma is uneven.

For example, by supplying a supply gas from one end of the wafer and exhausting the gas from the other end of the wafer, the amount of etching can be adjusted according to the positions on substrate 610. With this technique, plasma is generated more on the upstream side of the gas supply, and less on the downstream side. As a result, etching progresses more on the upstream side and less on the downstream side.

Another technique is to change the distribution of the high voltage to be applied even when the gas supply is uniform, to enable adjustment of the amount of etching according to the positions on substrate 610. For example, the amount of etching can be changed by applying a high voltage to one end of the wafer and a less voltage to the other end.

Figure 2I:
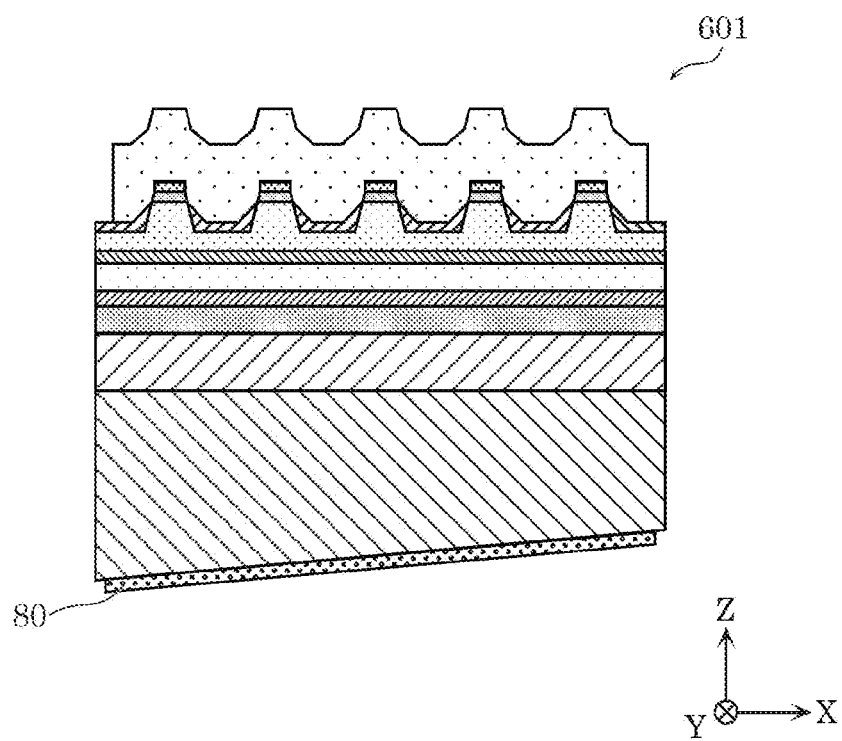
FIG. 2I is a cross-sectional view illustrating a process of forming an n-side electrode in the manufacturing method of the semiconductor light emitting element according to the embodiment.

Next, as illustrated in FIG. 2I, n-side electrode 80 is formed on the lower surface of substrate 610. Specifically, n-side electrode 80 including Ti/Pt/Au is formed on the undersurface of substrate 610 by vacuum deposition etc., and patterned by photolithography and etching to give n-side electrode 80 a predetermined shape. Through the above processes, semiconductor light emitting element 601 according to the present embodiment can be manufactured.

[Semiconductor Light Emitting Device]

Figure 3A:
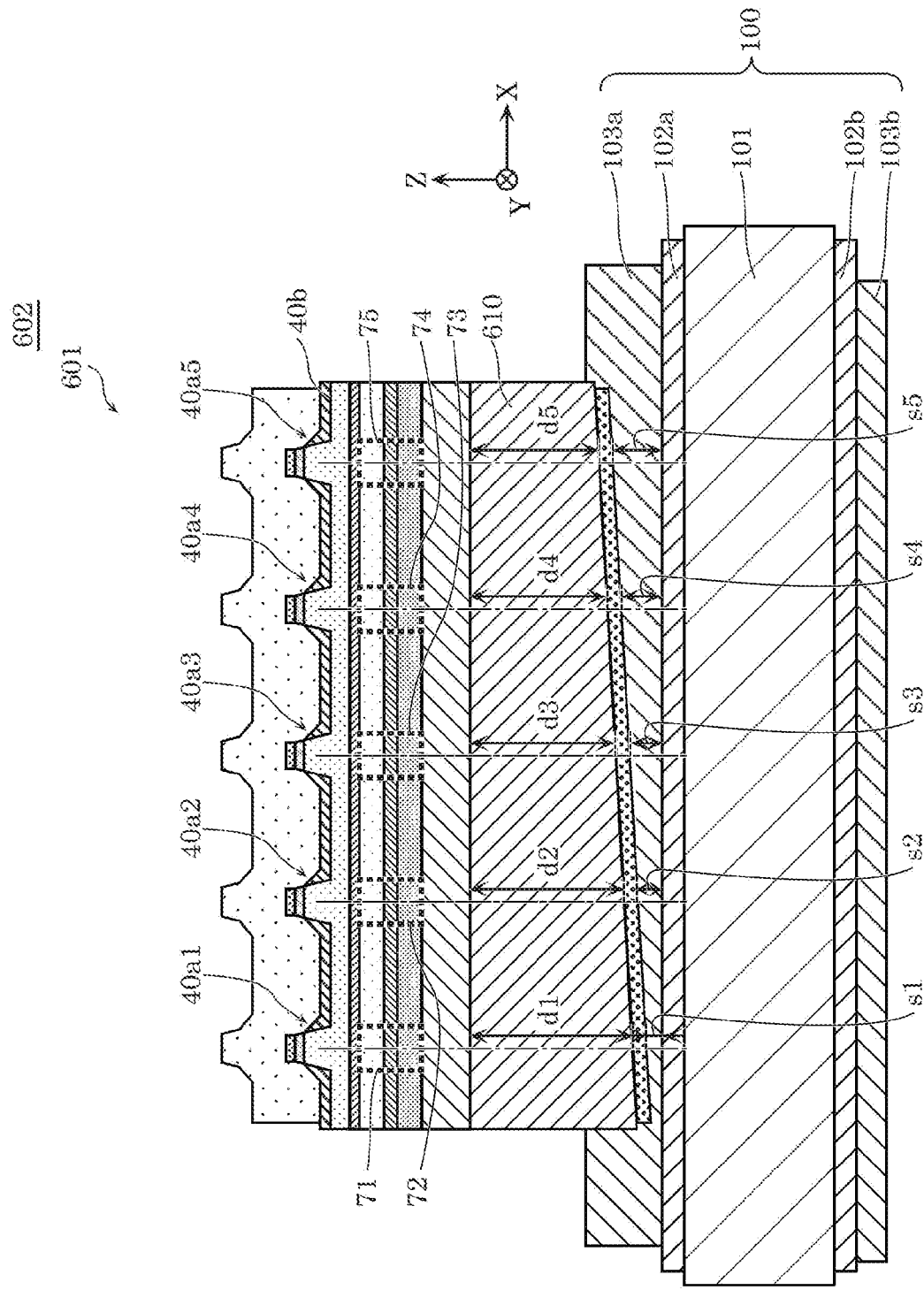
FIG. 3A is a schematic cross-sectional view illustrating a configuration of a semiconductor light emitting device according to the embodiment.

Next, a semiconductor light emitting device equipped with semiconductor light emitting element 601 according to the present embodiment will be described with reference to FIG. 3A. FIG. 3A is a schematic cross-sectional view illustrating a configuration of semiconductor light emitting device 602 according to the present embodiment. As illustrated in FIG. 3A, semiconductor light emitting device 602 includes semiconductor light emitting element 601 and submount 100. Submount 100 includes first base 101, first electrode 102a, third electrode 102b, first bonding layer 103a, and third bonding layer 103b.

First base 101 is a base disposed below substrate 610 of semiconductor light emitting element 601, and functions as a heat sink. The material of first base 101, which is not particularly limited, may be a material having a thermal conductivity equivalent to or higher than that of semiconductor light emitting element 601, such as ceramics (e.g., aluminum nitride (AlN) and silicon carbide (SiC)), diamond (C) formed by CVD, a simple metal (e.g., Cu and Al), or an alloy (e.g., CuW).

First electrode 102a is disposed on one surface of first base 101. Third electrode 102b is disposed on the other surface of first base 101. Each of first electrode 102a and third electrode 102b is a multilayer film including three metal films of Ti having a thickness of 0.1 μm, Pt having a thickness of 0.2 μm, and Au having a thickness of 0.2 μm, for example.

First bonding layer 103a is a bonding layer that bonds semiconductor light emitting element 601 to the first base. First bonding layer 103a is disposed above first electrode 102a. Third bonding layer 103b is disposed above third electrode 102b (on the lower side in FIG. 3A). Each of first bonding layer 103a and third bonding layer 103b is eutectic solder including a gold-tin alloy having an Au content of 70% and an Sn content of 30%, for example. In the present embodiment, the maximum thickness of each of first bonding layer 103a and third bonding layer 103b is approximately 6 μm. The thermal conductivity of first bonding layer 103a is lower than that of substrate 610 of semiconductor light emitting element 601 and that of first base 101.

Semiconductor light emitting element 601 is mounted on submount 100. The mounting type of the present embodiment is junction-up mounting, that is, a surface of semiconductor light emitting element 601 on the n-side electrode 80 side is connected to submount 100. Thus, n-side electrode 80 of semiconductor light emitting element 601 is connected to first bonding layer 103a of submount 100. Here, the upper surface of substrate 610 of semiconductor light emitting element 601 is parallel to a bonding surface of first base 101 bonded with first bonding layer 103a in the arrangement direction of light emitters 71 to 75. This allows the propagation direction of light emitted from semiconductor light emitting element 601 and the upper surface of first base 101 to be substantially parallel, and thus, the upper surface of first base 101 can be used as the reference for optical axis alignment. Accordingly, it is possible to realize semiconductor light emitting device 602 which allows easy optical axis adjustment.

As illustrated in FIG. 1B, thicknesses d1 to d5 of substrate 610 immediately below waveguide portions 40a1 to 40a5 have a relationship of d1>d2>d3>d4>d5. Here, as illustrated in FIG. 3A, the thicknesses of first bonding layer 103a immediately below five waveguide portions 40a1 to 40a5 (that is, immediately below light emitters 71 to 75) are sequentially defined as s1, s2, s3, s4, and s5 from the left. In the present embodiment, s1=1.0 μm, s2=1.6 μm, s3=2.3 μm, s4=3.3 μm, and s5=4.0 μm. Thicknesses s1, s2, s3, s4, and s5 have a relationship of s1<s2<s3<s4<s5. That is to say, the thickness of first bonding layer 103a is less on the left side than on the right side. Note that in the case of mounting semiconductor light emitting element 601 on first bonding layer 103a using gold-tin solder as in the present embodiment, the gold-tin solder brings about eutectic reaction with gold of n-side electrode 80 and gold of first electrode 102a. Thus, it sometimes becomes difficult to identify the boundary. In that case, the thickness of first bonding layer 103a here is defined as the distance between a layer in n-side electrode 80 that does not have eutectic reaction with gold-tin solder (for example, Pt) and a layer in first electrode 102a that does not have eutectic reaction with gold-tin solder (for example, Pt). Note that, although not illustrated in the drawings, submount 100 is mounted on, for example, a metal package in order to enhance heat dissipation and simplify the handling. Specifically, third bonding layer 103b allows submount 100 to be bonded to a metal package. Note that first base 101 itself may function as a package. In that case, submount 100 need not include third bonding layer 103b.

With semiconductor light emitting device 602 illustrated in FIG. 3A, semiconductor light emitting element 601 is junction-up mounted: however, junction-down mounting, which is a mounting type where the electrode component 50 side of semiconductor light emitting element 601 is connected to submount 100, may be applied. Hereinafter, such a mounting type will be described with reference to FIG. 3B.

Figure 3B:
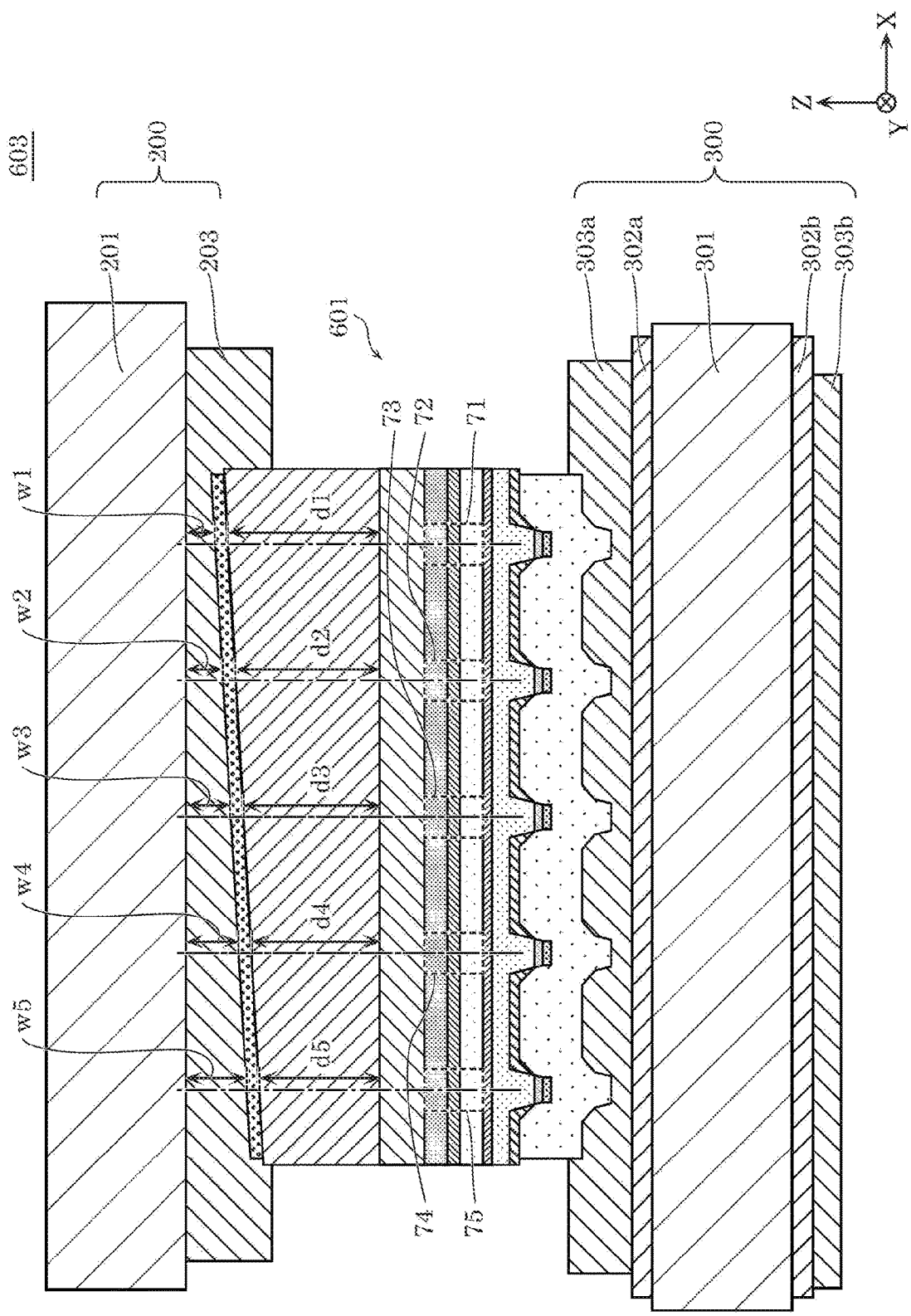
FIG. 3B is a schematic cross-sectional view illustrating a configuration of a semiconductor light emitting device according to a variation of the embodiment.

FIG. 3B is a schematic cross-sectional view illustrating a configuration of semiconductor light emitting device 603 according to a variation of the present embodiment. As illustrated in FIG. 3B, semiconductor light emitting device 603 according to the present variation includes semiconductor light emitting element 601, submount 300, and heat dissipater 200. Submount 300 includes second base 301, second electrode 302a, fourth electrode 302b, second bonding layer 303a, and fourth bonding layer 303b. Heat dissipater 200 includes first base 201 and first bonding layer 203.

First base 201 is a base disposed below (on the upper side in FIG. 3B) the lower surface (the surface on the upper side in FIG. 3B) of substrate 610 of semiconductor light emitting element 601. First bonding layer 203 is a bonding layer that bonds semiconductor light emitting element 601 to first base 201.

Second base 301 is a base disposed on the opposite side of semiconductor light emitting element 601 from first base 201. Second bonding layer 303a is a bonding layer that bonds semiconductor light emitting element 601 to second base 301. Second electrode 302a is disposed on one surface of second base 301. Fourth electrode 302b is disposed on the other surface of second base 301. In the present embodiment, second electrode 302a is disposed on a surface of second base 301 closer to semiconductor light emitting element 601.

Second base 301 and first base 201 according to the present variation have the same configuration as first base 101 of semiconductor light emitting device 602. Second electrode 302a and fourth electrode 302b according to the present variation have the same configuration as first electrode 102a and third electrode 102b of semiconductor light emitting device 602. Fourth bonding layer 303b has the same configuration as third bonding layer 103b of semiconductor light emitting device 602.

With semiconductor light emitting device 603, electrode component 50 of semiconductor light emitting element 601 is connected to second bonding layer 303a of submount 300. By junction-down mounting semiconductor light emitting element 601 in this manner, the p-side which is closer to the heat source is connected to submount 300, thus enabling enhancement of the heat dissipation of semiconductor light emitting element 601. Second bonding layer 303a is eutectic solder having a maximum thickness of approximately 3 μm and including a gold-tin alloy with an Au content of 70% and an Sn content of 30%, for example. In addition, heat dissipater 200 is connected on the n-side electrode 80 side to enhance the heat dissipation. Formed on one surface of heat dissipater 200 is first bonding layer 203, which is connected to n-side electrode 80. As described above, by interposing semiconductor light emitting element 601 with materials having a high thermal conductivity disposed on both sides of semiconductor light emitting element 601, it is possible to enhance the heat dissipation of semiconductor light emitting device 603.

In the present variation, first bonding layer 203 connected with n-side electrode 80 of semiconductor light emitting element 601 has varying thicknesses according to the positions in the arrangement direction. As illustrated in FIG. 3B, the thicknesses of first bonding layer 203 are defined as w1, w2, w3, w4, and w5. The thicknesses (d1 to d5) of substrate 610 are the same as those in semiconductor light emitting device 602. In the present embodiment, w1=1.3 μm, w2=2.2 μm, w3=3.2 μm, w4=4.1 μm, and w5=5.2 μm.

For example, as in the first mounting type, first bonding layer 203 has a structure in which eutectic solder having a maximum thickness of approximately 6 μm and including a gold-tin alloy with an Au content of 70% and an Sn content of 30% is formed on a multilayer film including three metal films of Ti having a thickness of 0.1 μm, Pt having a thickness of 0.2 μm, and Au having a thickness of 0.2 μm. In that case, n-side electrode 80 and heat dissipater 200 can be strongly connected, thus enabling efficient discharge of heat from semiconductor light emitting element 601. For example, a material which is soft relative to first base 201 and substrate 610, such as gold, can be used as first bonding layer 203. In that case, semiconductor light emitting element 601 cannot be fixed since first bonding layer 203 and n-side electrode 80 are merely in contact with each other; however, it is possible to discharge heat from the laser. In addition, the reliability is enhanced since this configuration allows reduction of unnecessary stress on semiconductor light emitting element 601.

In the present embodiment, a gold-tin alloy is used as the material of each bonding layer; however, a publicly-known material used for semiconductor bonding may be used, so long as it is a material having a thermal conductivity lower than that of substrate 610, first bases 101 and 201, and second base 301, such as Sn—Ag based or Sn—Cu based solder.

[External Resonance Type Laser Device]

Figure 4:
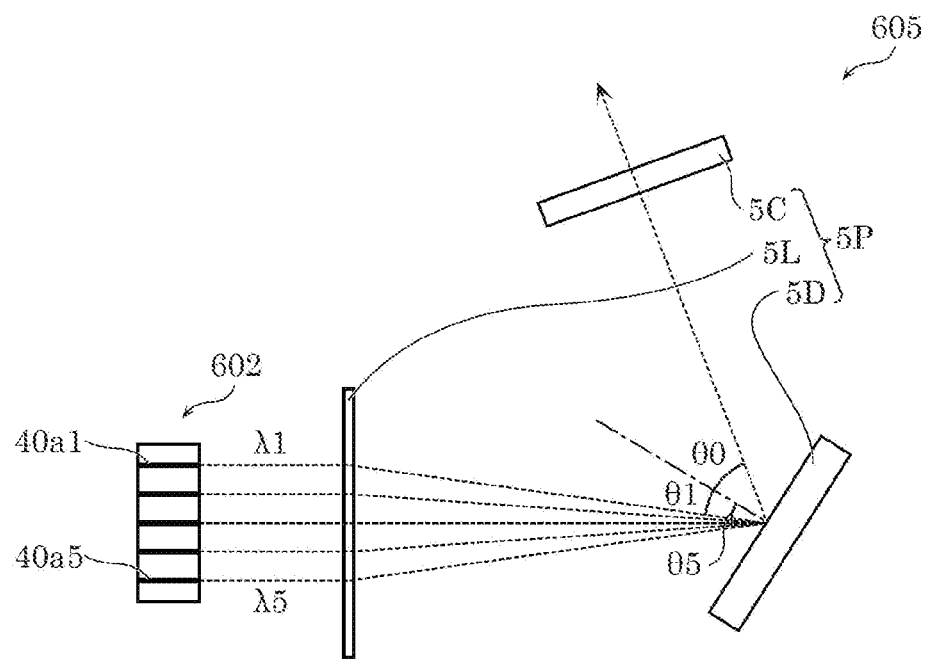
FIG. 4 is a schematic diagram illustrating a configuration of an external resonance type laser device according to the embodiment.

Next, an external resonance type laser device including semiconductor light emitting device 602 according to the present embodiment will be described with reference to FIG. 4. FIG. 4 is a schematic diagram illustrating a configuration of external resonance type laser device 605 according to the present embodiment. FIG. 4 also illustrates optical paths of light emitted from five waveguide portions 40a1 to 40a5 of semiconductor light emitting device 602.

As illustrated in FIG. 4, external resonance type laser device 605 according to the present embodiment includes semiconductor light emitting device 602 and optical system 5P. Optical system 5P used in combination with semiconductor light emitting device 602 includes optical lens 5L, diffraction grating 5D, and output coupler 5C. Optical lens 5L is a condenser lens disposed facing the light emission end surface of semiconductor light emitting element 601. Diffraction grating 5D is an example of the wavelength dispersion element according to the present embodiment, and performs wavelength beam combining on a plurality of laser beams emitted from semiconductor light emitting element 601. Output coupler 5C is an element used as a reflector on the output side of the external resonator including semiconductor light emitting element 601, and includes a partial reflector in the present embodiment.

Light emitted from semiconductor light emitting device 602 is focused on diffraction grating 5D by optical lens 5L. Diffraction grating 5D is an optical element whose relationship between the incident angle and the reflection angle of light has wavelength dependence. Waveguide portions 40a1 to 40a5 in semiconductor light emitting device 602 are in different positions. As illustrated in FIG. 4, the angles of light incident on diffraction grating 5D from waveguide portions 40a1 to 40a5 are θ1 to θ5, respectively. By appropriately adjusting the angle of diffraction grating 5D, light emitted from each waveguide portion can be reflected (diffracted) to the same direction (the direction that forms reflection angle θ0). The reflected light is guided to output coupler 5C and extracted to the outside. A portion of the light incident on output coupler 5C is reflected and returns to each waveguide portion again. Forming the external resonator with output coupler 5C and semiconductor light emitting device 602 in this manner enables laser oscillation. In addition, by making use of the wavelength dependence of reflection by diffraction grating 5D, it is possible to adjust the oscillation wavelengths (λ1 to λ5) of the waveguide portions of semiconductor light emitting device 602 according to the respective positions of the waveguide portions.

[Functions and Advantageous Effects of Semiconductor Light Emitting Element]

Figure 5:
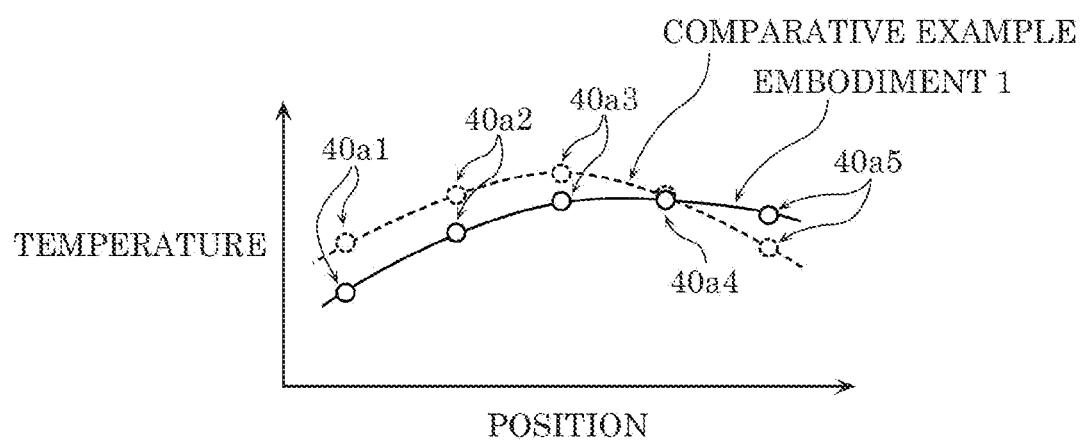
FIG. 5 is a graph illustrating an overview of the temperature of each waveguide portion of the semiconductor light emitting device according to the embodiment.

Next, functions and advantageous effects of semiconductor light emitting device 602 according to the present embodiment will be described with reference to FIG. 5. FIG. 5 is a graph illustrating an overview of the temperature of each waveguide portion of semiconductor light emitting device 602 according to the present embodiment. In FIG. 5, the solid line represents the temperature of each waveguide portion of semiconductor light emitting element 601 included in semiconductor light emitting device 602 according to the present embodiment, whereas the dashed line represents the temperature of each waveguide portion of a semiconductor light emitting device according to a comparative example having such a configuration as the one disclosed in PTL 1. With the conventional structure, the temperature of the central waveguide portion is higher than the temperatures of the waveguide portions located at the ends as shown by the dashed line in FIG. 5. This is because the central waveguide portion is more affected by the heat generated by the outer waveguide portions. In contrast, with semiconductor light emitting device 602 according to the present embodiment shown by the solid line, the temperature of a waveguide portion located at one end is decreased, whereas the temperature of a waveguide portion located at the other end is increased, thereby giving a tilt to the temperature distribution. This is an advantageous effect achieved by enhancing the heat dissipation effect on one end side by, as illustrated in FIG. 3A, making the thickness of first bonding layer 103a on the one end side (on the left side in FIG. 3A) less than the thickness of first bonding layer 103a on the other end side (the right side in FIG. 3A). The following specifically describes this advantageous effect. First bonding layer 103a includes a gold-tin alloy, and has a thermal conductivity of 57 W/m K. Substrate 610 includes GaN, and has a thermal conductivity of 200 W/mK. Since the thermal conductivity of first bonding layer 103a used for bonding is less than the thermal conductivity of substrate 610, the heat dissipation of first bonding layer 103a is enhanced when first bonding layer 103a is thinner. On the other hand, in order to maintain the bonding strength of semiconductor light emitting element 601 and first base 101, first bonding layer 103a needs a certain degree of thickness, and thus, first bonding layer 103a cannot be made thinner uniformly. In view of this, in the present embodiment, the left side of substrate 610 is made thicker, and first bonding layer 103a immediately therebelow is made thinner, thereby enhancing the heat dissipation on the left side only. Note that the same advantageous effect is achieved by semiconductor light emitting device 603 illustrated in FIG. 3B. Even with semiconductor light emitting device 603, the temperature distribution of the waveguide portions is tilted by giving first bonding layer 203 varying thicknesses.

Figure 6A:
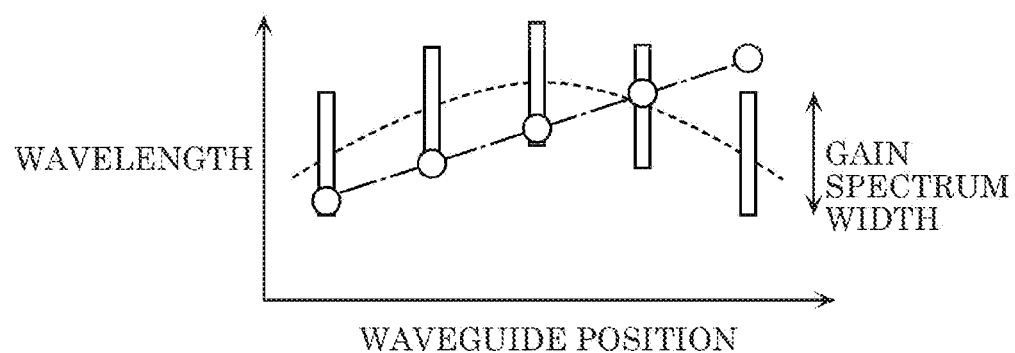
FIG. 6A illustrates gain spectra of the oscillation wavelengths in waveguide portions of a semiconductor light emitting device according to a comparative example.
Figure 6B:
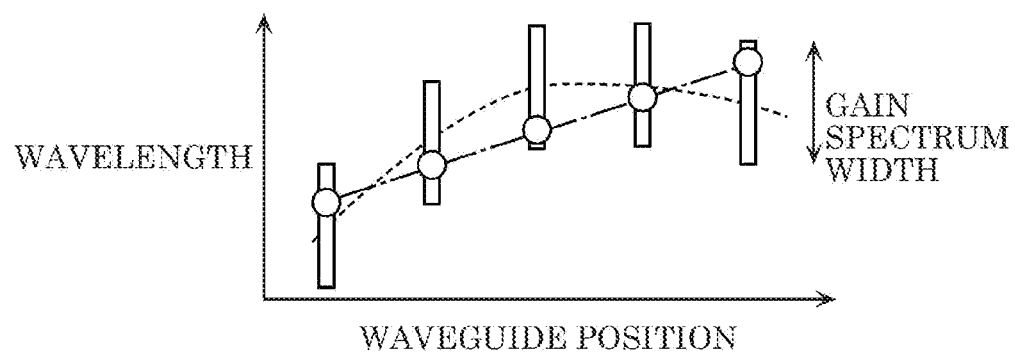
FIG. 6B illustrates gain spectra of the oscillation wavelengths in waveguide portions of the semiconductor light emitting device according to the embodiment.

The following describes, with reference to FIG. 6A and FIG. 6B, the gain spectra of the waveguide portions of semiconductor light emitting device 602 having the above temperature distribution of the waveguide portions. FIG. 6A and FIG. 6B illustrate the gain spectra of the oscillation wavelengths in the waveguide portions of semiconductor light emitting devices according to the comparative example and the present embodiment. In FIG. 6A and FIG. 6B, the gain spectra are illustrated with band-shaped rectangles. The gain spectrum of each waveguide portion has a certain width, and the spectral distribution varies according to the temperature. The gain spectrum shifts to the long wavelength side when the temperature is higher, and shifts to the short wavelength side when the temperature is lower. With the semiconductor light emitting device according to the comparative example illustrated in FIG. 6A, the temperature of the central waveguide portion is high, and thus, the gain spectrum of the central waveguide portion is shifted to the long wavelength side. The circles in FIG. 6A and FIG. 6B represent the oscillation wavelengths in the waveguide portions in the case of using such an external resonator as the one illustrated in FIG. 4. The left and central waveguide portions in FIG. 6A are capable of laser oscillation because the oscillation wavelengths in the case of using the external resonator are within the respective gain spectra. With the rightmost waveguide portion, however, the gain spectrum and the oscillation wavelength are significantly away from each other. In such a case, there arises a problem that the laser emission efficiency significantly declines or laser oscillation cannot be performed.

On the other hand, in the case of semiconductor light emitting device 602 according to the present embodiment illustrated in FIG. 6B, as compared to the temperatures of waveguide portions on one end side (the left side in FIG. 6B), the temperatures of waveguide portions on the other end side (the right side in FIG. 6B) can be made high. Thus, the gain spectra of the waveguide portions on the other end side can be shifted to the long wavelength side. With such semiconductor light emitting device 602, the oscillation wavelengths in the waveguide portions can gradually become longer, from the waveguide portions on the one end side toward the waveguide portions on the other end side. With this, when external resonance type laser device 605 is assembled from semiconductor light emitting device 602 and a wavelength dispersion element as illustrated in FIG. 4, it is possible to bring into agreement the oscillation wavelengths in the waveguide portions determined by the external resonator and the gain spectra of the waveguide portions of semiconductor light emitting device 602 as illustrated in FIG. 6B. Accordingly it is possible to inhibit a decline in the light emission efficiency of each waveguide portion of semiconductor light emitting device 602. As a result, even in the waveguide portions on the other end side (the right side in FIG. 6B), the oscillation wavelengths determined by the external resonator fall within the range of the respective gain spectra, and thus, efficient laser oscillation can be achieved.

Variations

The semiconductor light emitting element according to the present disclosure has been described above based on an embodiment; however, the present disclosure is not limited to this embodiment.

For example, the present disclosure encompasses embodiments obtained by making various modifications to the above embodiment that can be conceived by a person skilled in the art, as well as embodiments realized by arbitrarily combining constituent elements and functions in the above embodiment without departing from the essence of the present disclosure.

Figure 7A:
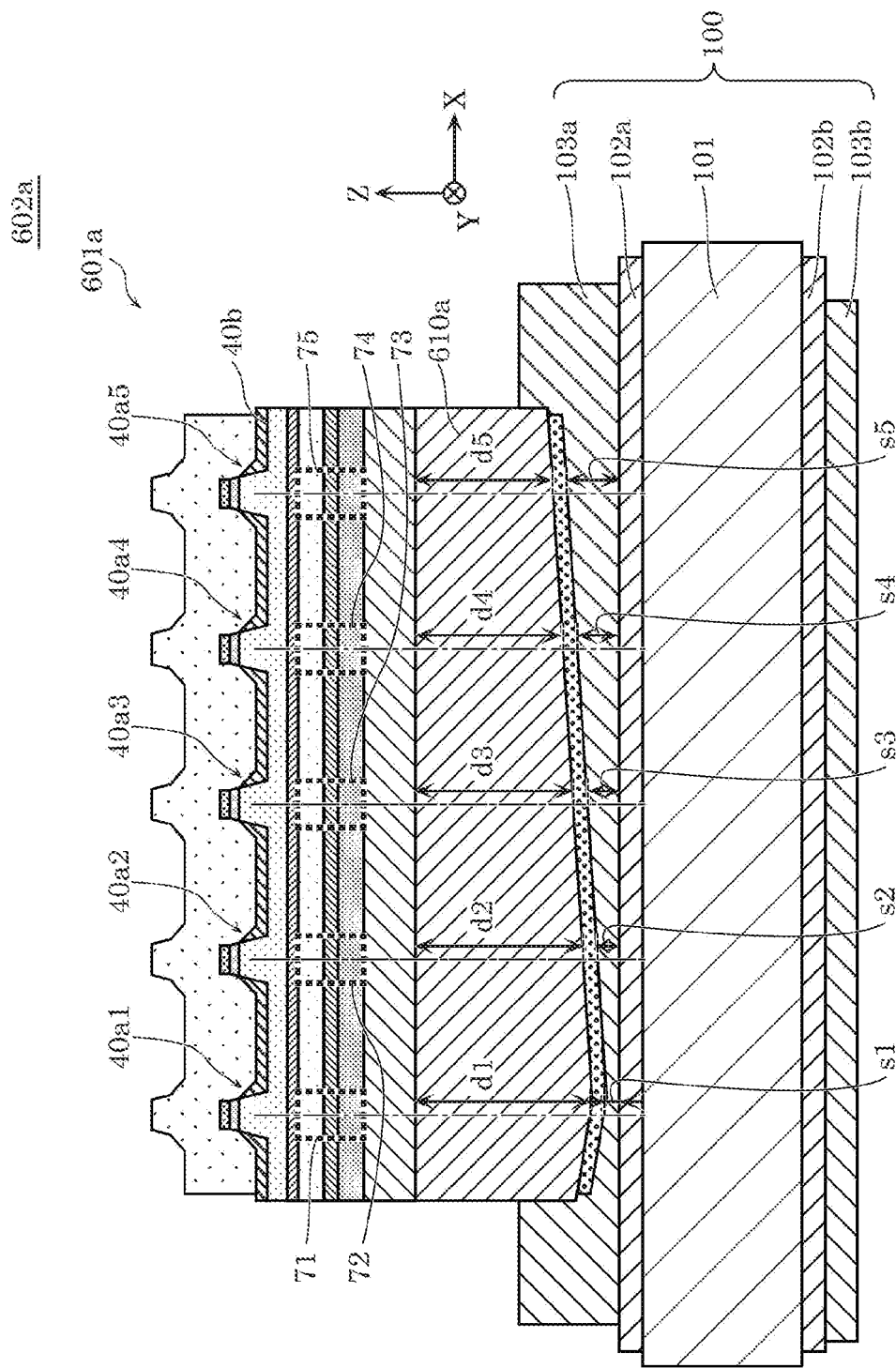
FIG. 7A is a schematic cross-sectional view illustrating a configuration of a semiconductor light emitting device according to Variation 1.
Figure 7B:
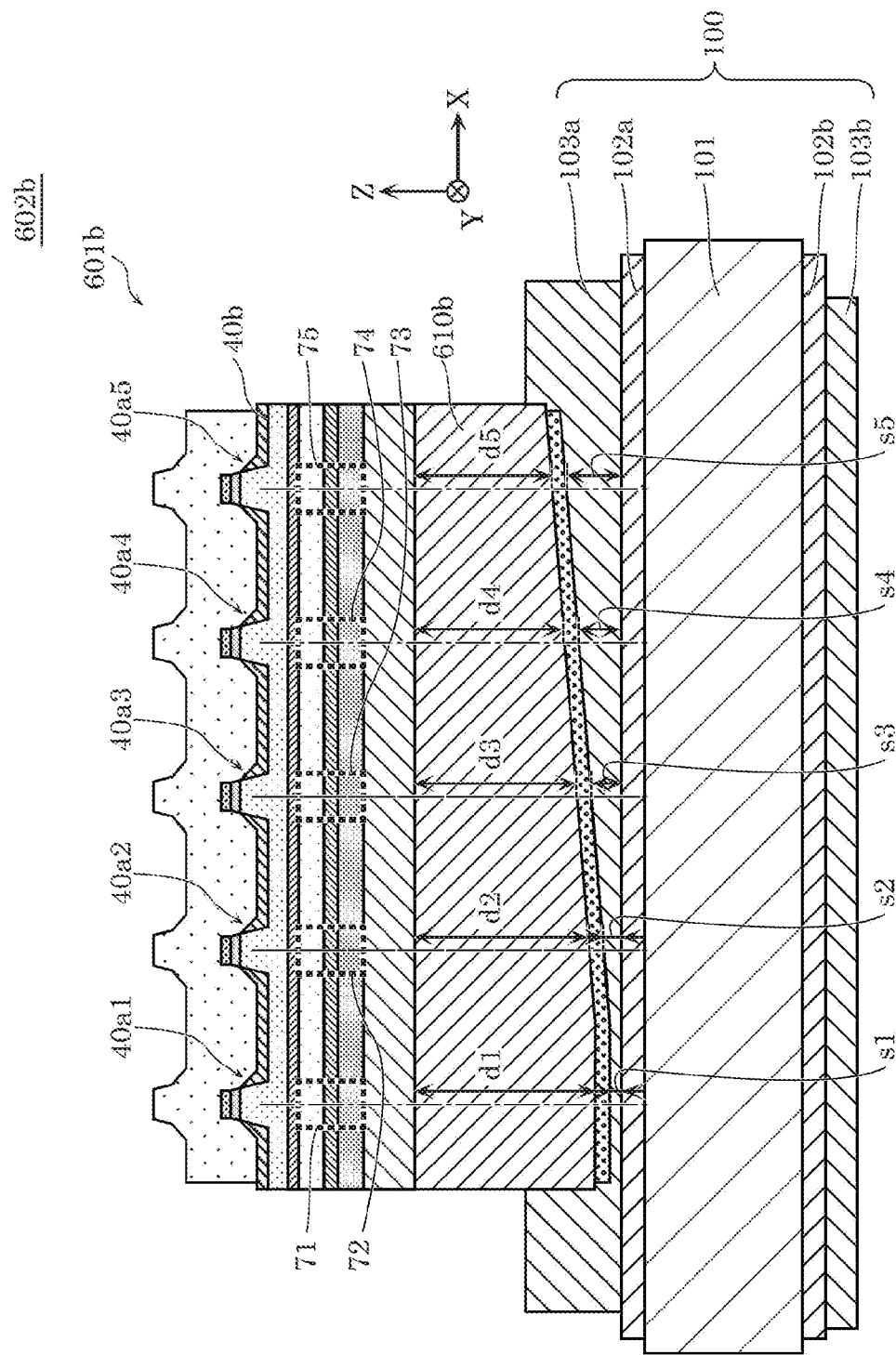
FIG. 7B is a schematic cross-sectional view illustrating a configuration of a semiconductor light emitting device according to Variation 2.
Figure 7C:
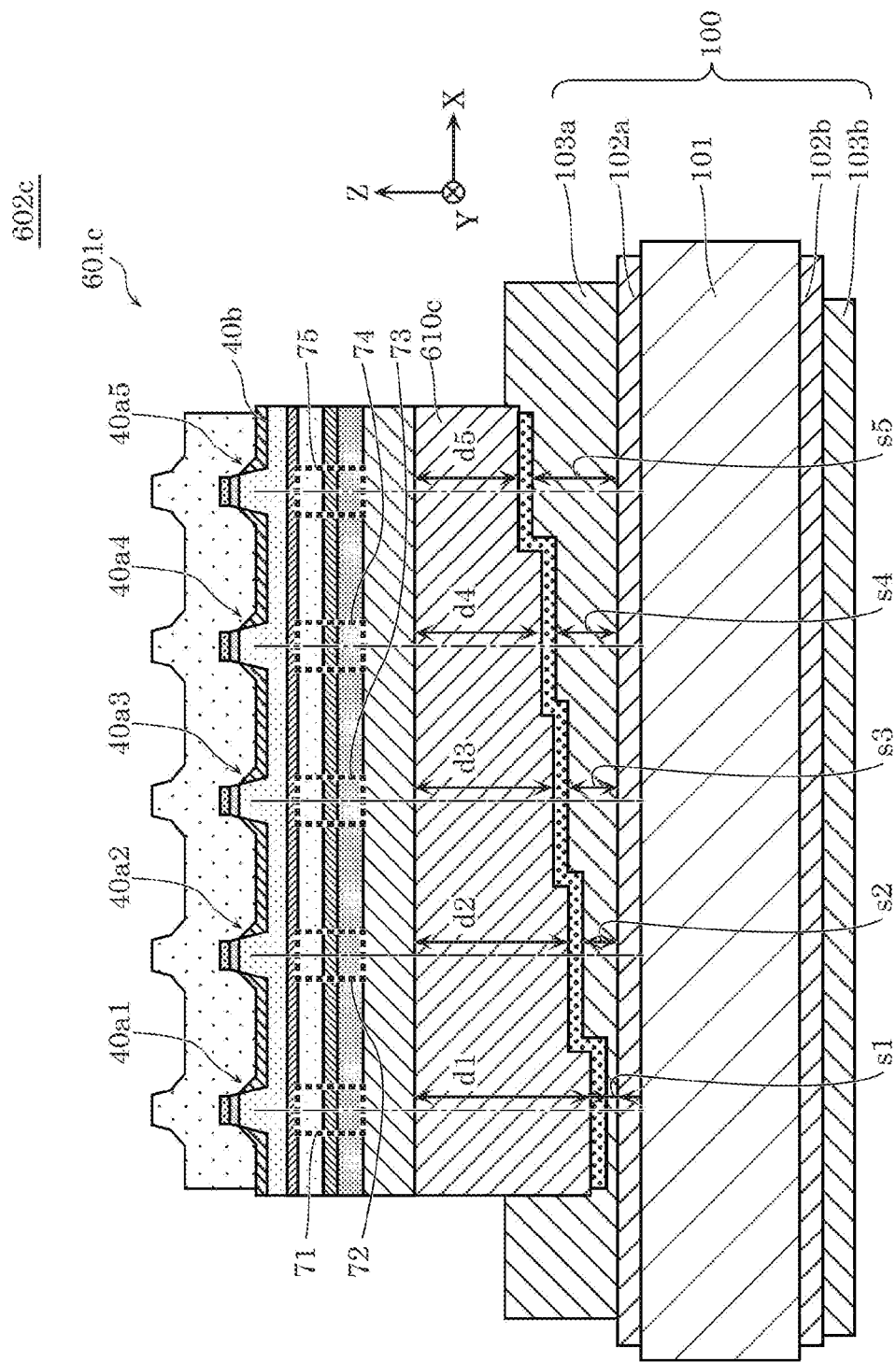
FIG. 7C is a schematic cross-sectional view illustrating a configuration of a semiconductor light emitting device according to Variation 3.
Figure 8:
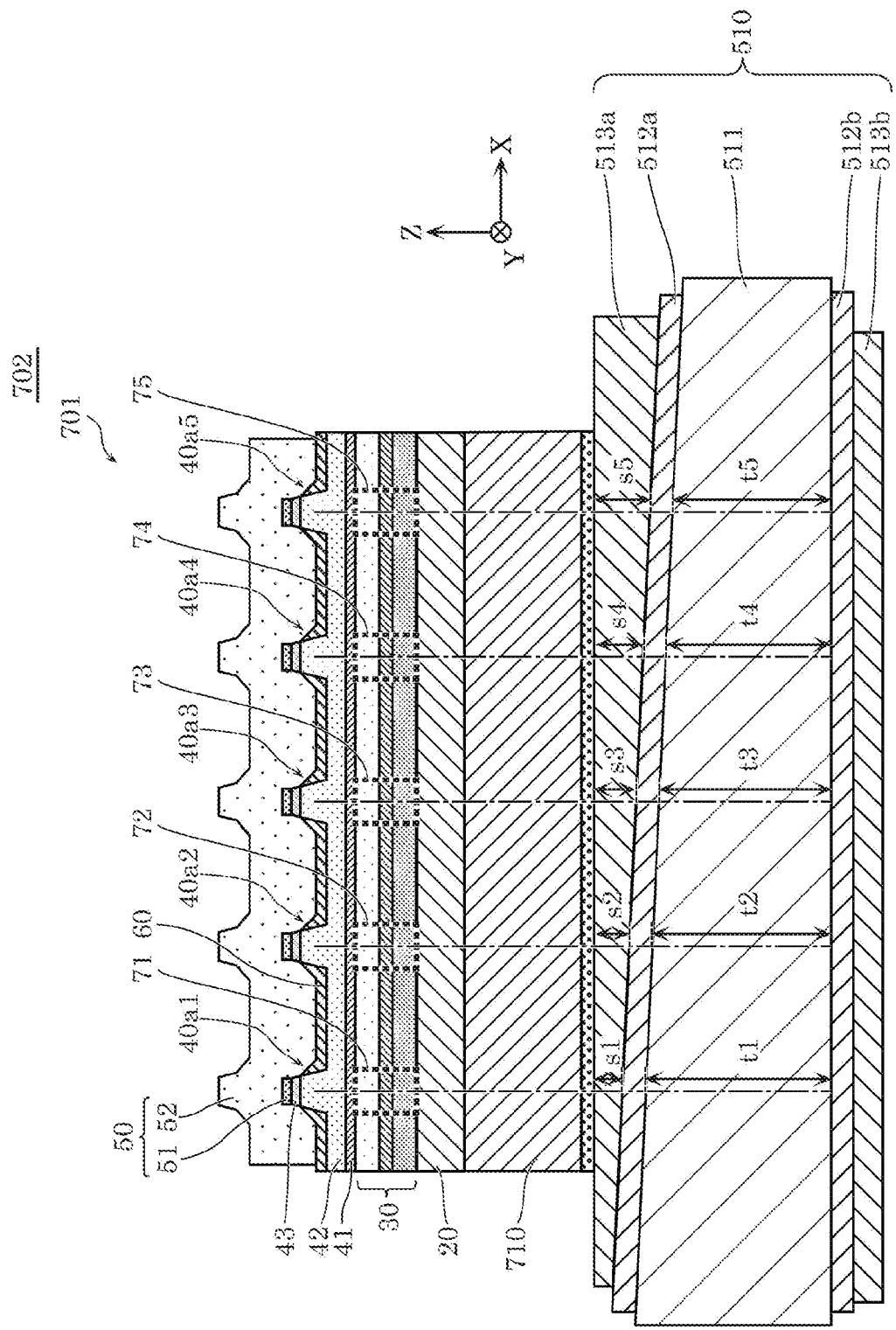
FIG. 8 is a schematic cross-sectional view illustrating a configuration of a semiconductor light emitting device according to Variation 4.
Figure 9:
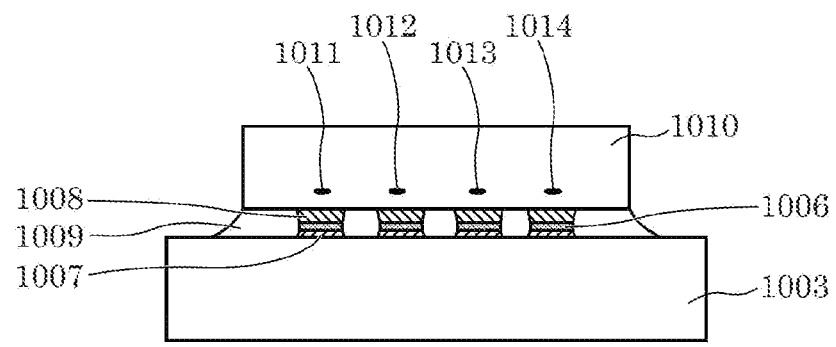
FIG. 9 illustrates a configuration of a conventional semiconductor laser.
Figure 10:
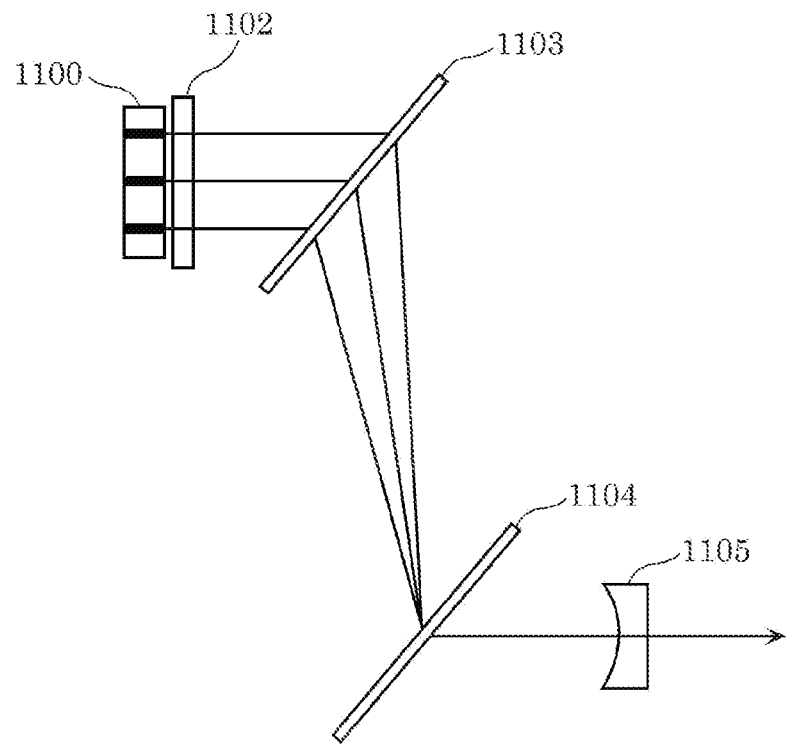
FIG. 10 illustrates an optical system which includes an external resonator of a conventional semiconductor laser.

For example, in semiconductor light emitting device 602 according to the above embodiment, substrate 610 of semiconductor light emitting element 601 has a maximum thickness at one end of substrate 610 (the left end in FIG. 1B); however, the configuration of substrate 610 is not limited to this. Hereinafter, variations will be described with reference to FIG. 7A to 7C and FIG. 8. FIG. 7A to FIG. 7C are schematic cross-sectional views illustrating configurations of semiconductor light emitting devices 602a to 602c according to Variations 1 to 3, respectively. FIG. 8 is a schematic cross-sectional view illustrating a configuration of semiconductor light emitting device 702 according to Variation 4. Semiconductor light emitting devices 602a to 602c illustrated in FIG. 7A to FIG. 7C are different from semiconductor light emitting device 602 according to the embodiment in shapes of substrate 610a to 610c of semiconductor light emitting elements 601a to 601c, and are the same as semiconductor light emitting device 602 in the other aspects.

As in semiconductor light emitting device 602a according to Variation 1 illustrated in FIG. 7A, substrate 610a need not have a maximum thickness at one end. In the example illustrated in FIG. 7A, substrate 610a has a maximum thickness in the vicinity of the region immediately below waveguide portion 40a1. Even with such a configuration, it is possible for thicknesses d1 to d5 of substrate 610a immediately below waveguide portions 40a1 to 40a5 to have a relationship of d1>d2>d3>d4>d5. Therefore, thicknesses s1 to s5 of first bonding layer 103a immediately below waveguide portions 40a1 to 40a5 have a relationship of s1<s2<s3<s4<s5. Accordingly, semiconductor light emitting device 602a according to the present variation can achieve the same advantageous effects as those achieved by semiconductor light emitting device 602 according to the embodiment.

As in semiconductor light emitting device 602b according to Variation 2 illustrated in FIG. 7B, the thickness of substrate 610b may be uniform in the region immediately below leftmost waveguide portion 40a1. In other words, the lower surface of substrate 610b may be partially parallel to the upper surface in the arrangement direction. Even with such a configuration, it is possible for thicknesses s1 to s5 of first bonding layer 103a immediately below waveguide portions 40a1 to 40a5 to have a relationship of s1<s2<s3<s4<s5. Accordingly, semiconductor light emitting device 602b according to the present variation can achieve the same advantageous effects as those achieved by semiconductor light emitting device 602 according to the embodiment.

As in semiconductor light emitting device 602c according to Variation 3 illustrated in FIG. 7C, the thickness of substrate 610c may vary in a stepwise manner. In other words, the thickness of substrate 610c may discretely vary. Even with such a configuration, it is possible for thicknesses s1 to s5 of first bonding layer 103a immediately below waveguide portions 40a1 to 40a5 to have a relationship of s1<s2<s3<s4<s5. Accordingly, semiconductor light emitting device 602c according to the present variation can achieve the same advantageous effects as those achieved by semiconductor light emitting device 602 according to the embodiment.

As in semiconductor light emitting device 702 according to Variation 4 illustrated in FIG. 8, submount 510 and semiconductor light emitting element 701 which includes substrate 710 having a uniform thickness may be included. Submount 510 includes first base 511, first electrode 512a, first bonding layer 513a, third electrode 512b, and third bonding layer 513b. Thicknesses t1 to t5 of first base 511 immediately below waveguide portions 40a1 to 40a5 according to the present variation are greater on one end side than on the other end side in the arrangement direction of light emitters 71 to 75 of semiconductor light emitting element 701. A surface of first base 511 on the semiconductor light emitting element 701 side is tilted downward from one end side (the left side in FIG. 8) toward the other end side (the right side in FIG. 8) in the arrangement direction. Accordingly, the thickness of first bonding layer 513a is less on the one end side than on the other end side in the arrangement direction of light emitters 71 to 75. In the present variation, the thermal conductivity of first base 511 is higher than that of first bonding layer 513a as in the above embodiment. As described above, in semiconductor light emitting device 702 according to the present variation, the thickness of first bonding layer 513a having a thermal conductivity lower than that of first base 511 is made less on the one end side in the arrangement direction, thereby allowing the heat dissipation of first bonding layer 513a to be higher on the one end side than on the other end side. With this, the gain spectra of, among the plurality of light emitters 71 to 75, light emitters on the other end side in the arrangement direction can be shifted to the longer wavelength side than the gain spectra of light emitters on the one end side. Accordingly, even with the present variation, it is possible to achieve the same advantageous effects as those achieved by semiconductor light emitting device 602 according to the embodiment.

Each of the above embodiment and variations has illustrated a configuration in which only one of the substrate and the first base has varying thicknesses in the arrangement direction of the plurality of light emitters; however, both of the substrate and the first base may have varying thicknesses. In addition, the thickness of the second base may be greater on one end side than on the other end side in the arrangement direction of the plurality of light emitters. This allows the thickness of the second bonding layer to be less on the one end side than on the other end side in the arrangement direction of the plurality of light emitters. As a result, as with the first base side, it is possible, even on the second base side, to enhance the heat dissipation on the one end side as compared to the heat dissipation on the other end side in the arrangement direction.

In addition, although a nitride semiconductor is used for the semiconductor light emitting element according to the above embodiment and variations, the semiconductor material used for the semiconductor light emitting element is not limited to this. For example, the semiconductor light emitting element may have a quantum well structure in which the active layer includes GaAs and AlGaAs, and emit a red laser beam, or may have a quantum well structure in which the active layer includes InP and InGaAsP, and emit an infrared laser beam.

Also, although the first bonding layer and the second bonding layer in the above embodiment and variations have thicknesses greater than zero, the first bonding layer and the second bonding layer may have a region where the thickness is zero. For example, the thicknesses of the first bonding layer and the second bonding layer may be zero at one end in the arrangement direction of the plurality of light emitters. In that case, the substrate of the semiconductor light emitting element may be in contact with the first base and the second base.

Also, although a semiconductor substrate is used as the substrate of the semiconductor light emitting element in the above embodiment and variations, the substrate of the semiconductor light emitting element need not be a semiconductor. For example, the substrate may be formed with sapphire etc. In that case, an electrode on the first conduction side may be disposed on the upper surface side of the substrate.

Also, although the semiconductor light emitting element according to the above embodiment and variations achieves current constriction using a stripe structure formed in the second semiconductor layer, the means for achieving current constriction is not limited to this, and an electrode stripe structure, an embedded structure, and so on may be used.

INDUSTRIAL APPLICABILITY

The semiconductor laser according to the present disclosure can be used as a light source for an image display device, lighting, or industrial equipment, and is particularly useful as a light source for equipment which requires relatively high light output.

The invention claimed is:
1. A semiconductor light emitting device, comprising:
a semiconductor light emitting element including a substrate and a plurality of light emitters arranged along an upper surface of the substrate;
a first base disposed below a lower surface of the substrate; and
a first bonding layer which bonds the semiconductor light emitting element to the first base,
wherein a thermal conductivity of the substrate is higher than a thermal conductivity of the first bonding layer,
a thickness of the first bonding layer is less on one end side than on an other end side in an arrangement direction in which the plurality of light emitters are arranged,
a thickness of the substrate is greater on the one end side than on the other end side in the arrangement direction, and the upper surface of the substrate is substantially parallel to a bonding surface of the first base bonded with the first bonding layer in the arrangement direction.

2. The semiconductor light emitting device according to claim 1, wherein
the lower surface of the substrate is tilted relative to the upper surface of the substrate in the arrangement direction.

3. The semiconductor light emitting device according to claim 1, further comprising:
a second base disposed on an opposite side of the semiconductor light emitting element from the first base; and
a second bonding layer which bonds the semiconductor light emitting element to the second base.

4. The semiconductor light emitting device according to claim 1, wherein
a thermal conductivity of the first base is higher than the thermal conductivity of the first bonding layer.

5. A semiconductor light emitting device, comprising:
a semiconductor light emitting element including a substrate and a plurality of light emitters arranged along an upper surface of the substrate;
a first base disposed below a lower surface of the substrate; and
a first bonding layer which bonds the semiconductor light emitting element to the first base,
wherein a thermal conductivity of the first base is higher than a thermal conductivity of the first bonding layer,
a thickness of the first bonding layer is less on one end side than on an other end side in an arrangement direction in which the plurality of light emitters are arranged,
a thickness of the substrate is greater on the one end side than on the other end side in the arrangement direction, and
the upper surface of the substrate is substantially parallel to a bonding surface of the first base bonded with the first bonding layer in the arrangement direction.

6. An external resonance type laser device, comprising:
the semiconductor light emitting device according to claim 1; and
a wavelength dispersion element.

* * * * *